United States Patent
Matsuo

(10) Patent No.: US 8,962,220 B2
(45) Date of Patent: Feb. 24, 2015

(54) REFLECTIVE PHOTOMASK AND REFLECTIVE PHOTOMASK BLANK

(75) Inventor: Tadashi Matsuo, Kuki (JP)

(73) Assignee: Toppan Printing Co., Ltd., Tokyo (JP)

( * ) Notice: Subject to any disclaimer, the term of this patent is extended or adjusted under 35 U.S.C. 154(b) by 109 days.

(21) Appl. No.: 13/262,321

(22) PCT Filed: Mar. 23, 2010

(86) PCT No.: PCT/JP2010/054973
§ 371 (c)(1),
(2), (4) Date: Sep. 30, 2011

(87) PCT Pub. No.: WO2010/113700
PCT Pub. Date: Oct. 7, 2010

(65) Prior Publication Data
US 2012/0021344 A1    Jan. 26, 2012

(30) Foreign Application Priority Data

Apr. 2, 2009   (JP) .................. P2009-089939
Sep. 16, 2009  (JP) .................. P2009-214348

(51) Int. Cl.
*G03F 1/24* (2012.01)
*B82Y 10/00* (2011.01)
*B82Y 40/00* (2011.01)
*G03F 1/58* (2012.01)

(52) U.S. Cl.
CPC . *G03F 1/24* (2013.01); *B82Y 10/00* (2013.01); *B82Y 40/00* (2013.01); *G03F 1/58* (2013.01)
USPC .............................................. 430/5

(58) Field of Classification Search
CPC ........................................ G03F 1/24
USPC ............................................. 430/4–5
See application file for complete search history.

(56) References Cited

U.S. PATENT DOCUMENTS

| 5,905,005 A * | 5/1999 | Yabe et al. ............. 430/5 |
| 6,178,221 B1 * | 1/2001 | Levinson et al. ........ 430/5 |
| 6,180,291 B1 * | 1/2001 | Bessy et al. ........... 430/5 |
| 2003/0027053 A1 * | 2/2003 | Yan .................... 430/5 |
| 2004/0196579 A1 | 10/2004 | Shoki |
| 2005/0084768 A1 * | 4/2005 | Han et al. .............. 430/5 |
| 2005/0208389 A1 | 9/2005 | Ishibashi et al. |

(Continued)

FOREIGN PATENT DOCUMENTS

| JP | 3078163 | 5/1995 |
| JP | 2001-237174 | 8/2001 |

(Continued)

OTHER PUBLICATIONS

JPO machine translation of Kanayama et al. (JP-2009-099931, published May 7, 2009).*

(Continued)

*Primary Examiner* — Stephen Rosasco

(57) ABSTRACT

Provided is a reflective photomask reflecting an EUV light and used to irradiate a reflected light to a transfer sample, the reflective photomask including: a substrate; a high reflection part formed on the substrate; and a low reflection part formed on the high reflection part and being patterned, wherein the low reflection part, being patterned, includes at least one or more layers being stacked; and at least one layer of the low reflection part, being patterned, includes a layer including an Sn and an oxygen.

7 Claims, 24 Drawing Sheets

(56) References Cited

U.S. PATENT DOCUMENTS

| | | |
|---|---|---|
| 2006/0251973 A1 | 11/2006 | Takaki et al. |
| 2007/0238033 A1* | 10/2007 | Kanayama et al. ............... 430/5 |
| 2008/0248409 A1 | 10/2008 | Ishibashi et al. |
| 2009/0130569 A1 | 5/2009 | Quesnel |

FOREIGN PATENT DOCUMENTS

| | | |
|---|---|---|
| JP | 2004-6798 | 1/2004 |
| JP | 2004-304170 | 10/2004 |
| JP | 2006-228766 | 8/2006 |
| JP | 2008-539573 | 11/2008 |
| JP | 2009-88166 | 4/2009 |
| JP | 2009-99931 | 5/2009 |
| JP | 2009-218459 | 9/2009 |
| JP | 2009-229554 | 10/2009 |
| JP | 2010-103463 | 5/2010 |
| WO | WO 2007/039161 A1 | 4/2007 |

OTHER PUBLICATIONS

International Search Report for PCT/JP2010/054973, mailed Jun. 1, 2010.

Tadashi Matsuo et al. "Novel Absorber Material for EUV Lithography Mask", Proceedings of SPIE, vol. 7379, 2009, pp. 1-8.

Hee Young Kang et al., "Absorber stack with transparent conductive oxide layer for extreme ultraviolet lithography", J. Vac. Sci. Technol. B, vol. 27, No. 1, 2009, pp. 58-60.

Hee Young Kang et al., "Design of Hybrid Attenuated Phase-Shift Masks with Indium—Tin—Oxide Absorbers for Extreme Ultraviolet Lithography", Journal of the Korean Physical Society, vol. 53, No. 3, Sep. 2008, pp. 1638-1641.

International Search Report mailed Jun. 1, 2010 issued in corresponding International Patent Application No. PCT/ JP2010/054973.

Extended European Search Report mailed Mar. 4, 2014 in corresponding European Application No. 10758474.0.

* cited by examiner

FIG. 3

| WAVELENGTH | 13.5nm | | 199nm | | 257nm | |
|---|---|---|---|---|---|---|
| OPTICAL CONSTANTS | n(REFRACTIVE INDEX) | k(EXTINCTION COEFFICIENT) | n(REFRACTIVE INDEX) | k(EXTINCTION COEFFICIENT) | n(REFRACTIVE INDEX) | k(EXTINCTION COEFFICIENT) |
| SiN | 0.988 | 0.00949 | 2.37 | 0.43 | 2.19 | 0.20 |
| SnO | 0.936 | 0.0721 | 1.87 | 0.617 | 2.19 | 0.341 |
| Ta | 0.958 | 0.0369 | 1.93 | 1.94 | 2.12 | 2.13 |
| TaN | 0.941 | 0.0346 | 1.74 | 1.93 | 1.79 | 1.88 |
| CrN | 0.930 | 0.0335 | 1.14 | 1.84 | 1.29 | 2.36 |
| Si | 0.999 | 0.00183 | 0.996 | 2.13 | 1.73 | 2.78 |
| Ru | 0.887 | 0.0176 | 0.763 | 2.03 | 1.03 | 2.87 |
| Mo | 0.921 | 0.00646 | 0.80 | 2.46 | 1.72 | 3.74 |

SiN/SnO(27nm)/Si(11nm)/ML

SiN/SnO(27nm)/Ru(2.5nm)/ML

SiN/SnO(20nm)/CrN(10nm)/Si(11nm)/ML

SiN/SnO(20nm)/TaN(10nm)/Si(11nm)/ML

SiN/SnO(20nm)/CrN(10nm)/Ru(2.5nm)/ML

SiN/SnO(20nm)/TaN(10nm)/Ru(2.5nm)/ML

FIG. 10

| COMPOUND | BOILING POINT (°C) |
|---|---|
| $TaCl_5$ | 239 |
| $TaF_5$ | 230 |
| $Cl_2CrO_2$ | 117 |
| $SnCl_4$ | 114 |

FIG. 20

| ① ANTI-REFLECTION FILM (THICKNESS/nm) | ② UPPER LAYER ABSORPTION FILM (THICKNESS/nm) | ③ LOWER LAYER ABSORPTION FILM OR BUFFER FILM (THICKNESS/nm) | DUAL PURPOSE FILM OR CAPPING FILM (THICKNESS/nm) | ①+②+③ FILM THICKNESS (nm) | PHASE DIFFERENCE (deg.) | REFLECTANCE (%) |
|---|---|---|---|---|---|---|
| SiN(16) | RuO(31) | TaSi(10) | Si(11) | 57 | 180 | 10 |
| ↑ | Ru(19) | TaSi(25) | Ru(2.5) | 60 | ↑ | 9 |
| ↑ | RuO(23) | TaSi(27) | Ru(2.5) | 88 | ↑ | 6 |
| ↑ | RuO(26) | ↑ | Si(11) | 69 | ↑ | 5 |
| ↑ | Ru(17) | ↑ | Ru(2.5) | 60 | ↑ | 8 |
| ↑ | Ru(19) | ↑ | Si(11) | 62 | ↑ | 8 |
| ↑ | RuO(21) | TaSi(30) | Ru(2.5) | 67 | ↑ | 4.5 |
| ↑ | RuO(17) | TaN(25) | Si(11) | 58 | ↑ | 6 |
| ↑ | RuO(18.5) | ↑ | Ru(2.5) | 59.5 | ↑ | 7.5 |
| ↑ | Ru(14.5) | ↑ | Si(11) | 55.5 | ↑ | 9.5 |
| ↑ | Ru(13) | ↑ | Ru(2.5) | 54 | ↑ | 10.5 |
| ↑ | RuO(30) | CrN(10) | Si(11) | 56 | ↑ | 13 |
| ↑ | RuO(14) | CrN(27) | Si(11) | 57 | ↑ | 9 |
| ↑ | Ru(12) | ↑ | Si(11) | 55 | ↑ | 10 |
| ↑ | Ru(11) | CrN(30) | Si(11) | 57 | ↑ | 9 |

FIG. 21

|  | REFRACTIVE INDEX (n) | EXTINCTION COEFFICIENT (k) |
|---|---|---|
| SiN | 0.982 | 0.00660 |
| Ta Si | 0.958 | 0.0369 |
| TaN | 0.938 | 0.0352 |
| Ru | 0.887 | 0.0231 |
| RuO | 0.921 | 0.0247 |
| CrN | 0.930 | 0.0335 |
| Si | 0.999 | 0.00183 |
| Mo | 0.921 | 0.00646 |
| Quartz | 0.978 | — |
| SnO | 0.936 | 0.0722 | a) SnO(17nm-thick)/Ru/Si-cap(11nm)/ML40pairs b) SiN(6nm)/SnO/RuO(35nm)/Si-cap(11nm)/ML40pairs c) SiN(4nm)/SnO/Ru(19.5nm)/Si-cap(11nm)/ML40pairs d) SnO(17nm-thick)/Ru/SiN-cap(2nm-thick)/ML40pairs e) SiN(4nm)/SnO/Ru(18.5nm)/SiN-cap(2nm)/ML40pairs f) SiN(4nm)/SnO/Ru(19nm)/Si-cap(11nm)/ML40pairs g) SiN(6nm)/SnO/Ru(19nm)/Si-cap(11nm)/ML40pairs h) SiN(4nm)/SnO/Ru(20nm)/Si-cap(11nm)/ML40pairs i) SiN(6nm)/SnO/Ru(20nm)/Si-cap(11nm)/ML40pairs j) SiN(4nm)/SnO/Ru(21nm)/Si-cap(11nm)/ML40pairs

FIG. 33

| ① ANTI-REFLECTION FILM (THICKNESS/nm) | ② UPPER LAYER ABSORPTION FILM (THICKNESS/nm) | ③ LOWER LAYER ABSORPTION FILM OR BUFFER FILM (THICKNESS/nm) | DUAL PURPOSE FILM OR CAPPING FILM (THICKNESS/nm) | ①+②+③ FILM THICKNESS (nm) | PHASE DIFFERENCE (deg) | REFLECTANCE (%) |
|---|---|---|---|---|---|---|
| — | SnO(17) | Ru(21.5) | Si(11) | 38.5 | 180 | 5.7 |
| SiN(6) | SnO(12.5) | RuO(35) | ↑ | 47.5 | ↑ | 6 |
| SiN(4) | SnO(14.7) | Ru(19.5) | ↑ | 34.2 | ↑ | 6 |
| — | SnO(17) | Ru(20) | SiN(2) | 37 | ↑ | 5.7 |
| SiN(4) | SnO(14) | Ru(18.5) | ↑ | 32.5 | ↑ | 6.8 |
| SiN(4) | SnO(20) | Ru(19) | Si(11) | 39 | ↑ | 5 |
| SiN(6) | SnO(20.5) | Ru(19) | ↑ | 39.5 | ↑ | 5 |
| SiN(4) | SnO(18) | Ru(20) | ↑ | 38 | ↑ | 5 |
| SiN(6) | SnO(14) | Ru(20) | ↑ | 34 | ↑ | 7 |
| SiN(4) | SnO(12.5) | Ru(21) | ↑ | 33.5 | ↑ | 10 |
| SiN(6) | SnO(12.5) | Ru(21) | ↑ | 34 | ↑ | 11 |

=== PAGE 1 ===
REFLECTIVE PHOTOMASK AND REFLECTIVE PHOTOMASK BLANK

CROSS REFERENCE TO RELATED APPLICATIONS

This is a U.S. National Phase Application under 35 U.S.C. §371 of International Patent Application No. PCT/JP2010/054973 filed Mar. 23, 2010, which claims the benefit of Japanese Patent Application No. 2009-089939, filed Apr. 2, 2009 and Japanese Patent Application No. 2009-214348, filed Sep. 16, 2009, all of which are hereby incorporated by reference.

TECHNICAL FIELD

The present invention relates to a reflective photomask and a reflective photomask blank.

BACKGROUND ART

In recent years, an exposure method using an extreme ultra violet ray (hereinafter abbreviated as "EUV" for Extreme Ultra Violet) is suggested. The wavelength of an EUV exposure light is small. As a result, the refractive index of a material is close to the value of a vacuum. In addition, there is only a small difference between the light absorption of different ingredients. Therefore, in an EUV wavelength region, a traditional transparent dioptric system cannot be made. Thus, a catoptric system is attained. Hence, the photomask becomes a reflective photomask.

According to a general reflective photomask developed so far, a configuration was applied such that a high reflection part and a low reflection part are provided on a Si wafer or a glass substrate. The high reflection part includes a multi-layered reflection film and a capping film. The multi-layered reflection film is provided by stacking approximately 40 sets of double-layered films including Mo and Si, for instance. The capping film protects the multi-layered reflection film. The low reflection part is formed as a pattern of an absorption film and a buffering film on the high reflection part. The buffering film is a film acting to mitigate a damage on the capping film and the multi-layered reflection film when dry etching on absorption film and a repair on a defect by an ion beam or a laser are made. The buffering film is patterned after the defect on the absorption film is repaired.

According to a reflective photomask as described above, the low reflection part, which absorbs an EUV light, is normally configured to have a low reflectance with reference to a deep ultraviolet ray (hereinafter abbreviated as "DUV" for Deep Ultra Violet) in order to attain a contrast at the time of a pattern defect inspection. The DUV is a defect testing light. In order to attain a low reflectance, an anti-reflection (hereinafter referred to as "AR" for Anti Reflection) effect is utilized. This AR effect uses the so-called thin film interference. Therefore, on the top-most layer of the low reflection part, a film having a transparency with reference to DUV light is formed as an AR film.

In this way, the low reflection part is configured as a laminated structure such that various films like an AR film, an absorption film, and a buffer film, etc., are stacked in this order from a side farther from the substrate. The AR film attains a low reflectance with reference to a DUV light. The absorption film absorbs an EUV light. The buffering film mitigates damages to the capping film and the multi-layered reflection film.

Further, the capping film may also act as a buffer film when the capping film has transparency with reference to an EUV light, while at the same time having a high durability with reference to the dry etching of the absorption film, and when the repair of a defect of the absorption film is performed using an electron beam imposing only a small amount of damage. Such a capping film is called a dual purpose film.

Conventionally, a layer having Ta and Cr as primary components is formed as an absorption film of a reflective photomask for an exposure method using the EUV light (See Patent Document 1).

Not limited to the case using an EUV exposure, a first optical characteristic, required of a photomask to achieve a transfer exposure by a projection exposure, is a mask contrast. Normally, according to a transparent type mask, the mask contrast is represented by the following Equation (1). Here, T indicates the intensity of the transparent light which passed through the transparent substrate. To indicates the intensity of the transparent light which passed through a patterned part including a light shielding film.

$$OD = -\log(To/T) \quad (1)$$

Here, OD refers to an optical density (Optical density). OD indicates the degree of light blocking effect of the light shielding film.

The mask contrast may be evaluated in a similar manner in the case of the reflective photomask. Since this mask is a reflective photomask, the mask contrast is evaluated by the following Equation (2), similar to the case of the transparent type mask. Here, Rm refers to the intensity of the reflected light from a high-reflection part. Ra refers to the intensity of the reflected light from a low-reflection part including the absorption film.

$$OD = -\log(Ra/Rm) \quad (2)$$

In general, in order to perform a good EUV transfer, it is preferable that the OD be greater than or equal to 1.5.

An EUV exposure is a reflective exposure. As a result, the incident light enters the reflective photomask not from a perpendicular direction, but from a slightly slanted direction (usually approximately 6 degrees), and becomes a reflected light. At this time, the EUV light is incident from a slanted angle. As a result, due to the patterned low-reflection part, a shadow of a pattern is created. Therefore, depending on the direction of the incidence and a direction in which the pattern is aligned, a deviation from an intrinsic position occurs at the transferred resist pattern on the wafer created with the reflected light. In this way, the accuracy of the pattern position deteriorates. This effect is referred to as a shadowing effect (Shadowing Effect). There is a problem with the EUV exposure in that this shadowing effect should be restrained.

In order to restrain the shadowing effect, the length of the shadow may be reduced. Thus, to reduce the length of the shadow, the height of the pattern may be made to be as small as possible. In other words, it is preferable to form the low reflection part as thin as possible.

In order to retain a mask contrast of OD>1.5 even though the low reflection part is made thinner, it is important to use a material having a large absorption characteristic with reference to the EUV light.

Further, in general, not limited to the reflective photomask, a photomask is repeatedly exposed to a cleansing liquid using acid and alkali and the like during the manufacturing process of the photomask and during the usage period in a transfer exposure. It is preferred that a thin film included in the mask have adequate durability against these cleansing liquids. Further, it is preferable that the thin film, which is to be patterned, have an adequate etching suitability (etch rate) so that a minute pattern may be formed on the thin film.

From above, according to a reflective photomask, in order to obtain film thickness of the patterned part is as thin as possible and also obtain a preferable mask contrast of OD>1.5, it is preferable that the low reflection part have a layer including a material having a high EUV light absorption characteristic, a high durability against cleansing liquid, and a high suitability for etching. However, a favorable film material satisfying these conditions has not been suggested.

Meanwhile, a technique for enhancing resolution using a phase shift mask has been suggested. A phase shift mask provides a phase difference of 180 degrees to a light that has passed through the phase shift mask. The transparent part of the mask pattern has a different material or a different shape compared to an adjacent transparent part. Therefore, in a region between these transparent parts, transmission diffraction light having a phase difference of 180 degrees cancel out each other. As a result, the intensity of the light becomes extremely small. Thus, the mask contrast is enhanced. Consequently, the focal depth of at the time of transfer expands. At the same time, the transfer accuracy enhances as well. Incidentally, in theory, it is ideal to have a phase difference of 180 degrees. However, the effect of enhancing resolution may be obtained as long as the phase difference is essentially 175 degrees to 185 degrees.

A half tone type is a type of a phase shifting mask. As a material included in a mask pattern, the half tone type uses a thin film which is semipermeable with reference to an exposure light (hereinafter referred to as a halftone film). Thus, the transmittance may be diminished to approximately several percent (usually, the transmittance is approximately 4% to 15% with reference to a light passing through a substrate). Further, a phase difference of approximately 175 degrees to 185 degrees may be provided with reference to the light passing through the substrate. As a result, the phase shift mask enhances the resolution of the pattern edge part. Further, the phase shift mask enhances the transfer accuracy.

Here, an appropriate range of a transmittance of a halftone type phase shift mask is described. According to a conventional halftone type mask for an excimer laser, it is preferable that the transmittance of the halftone film satisfy an optical condition of 4% to 15% in general with reference to an ultraviolet ray having an exposure wavelength. This is because, first of all, when the transmittance of the halftone film at the exposure wavelength is less than or equal to 4%, and when there is an overlap in the diffracted light of the light that has passed through the adjacent transparent part, the cancelling effect becomes small. On the other hand, when the transmittance is greater than or equal to 15%, the resolution limit of the resist is exceeded depending on the exposure conditions. Thus, an extra pattern is formed in a region of the halftone film through which the light passed.

The EUV exposure uses a catoptric system. Since an NA (Numerical Aperture) is small, and since the wavelength is short, the EUV exposure has a unique problem in that the EUV exposure is susceptible to the roughness on the surface of the mirror and the mask. Thus, it is not easy to resolve minute line widths with the targeted accuracy. Therefore, a halftone type reflective photomask is suggested (see, for example, Patent Document 2), which makes the absorption film act as a halftone film as well, in order to allow the principles of the halftone type mask to be applied to the EUV exposure as well. This EUV exposure uses a catoptric system. The principles of the halftone type mask are used in a traditional excimer laser exposure and the like.

The principles for enhancing the resolution with a phase shift effect are the same for a reflective photomask as well. The "transmittance" described above is simply replaced with "reflectance." The appropriate values of the transmittance and the reflectance are considered to be approximately the same. In other words, it is preferred that the reflectance at the low reflection region with reference to the high reflection region be 4% to 15%.

Incidentally, using the half tone type photomask is in principle an effective way to enhance the resolution in lithography. However, normally, the most appropriate transmittance and the reflectance of a half tone type photomask relies on exposure conditions and the pattern that is transferred. Thus, it is difficult to determine a certain value.

Therefore, a configuration is preferred such that the reflectance may be selected (freely) in the range of approximately 4% to approximately 15%, even in the case of a halftone type reflective photomask when a light reflected from a patterned low reflection part has a phase difference of 175 to 185 degrees with reference to a light reflected from a high reflection part.

PRIOR ART DOCUMENT

Patent Document

[Patent Document 1] Japanese Unexamined Patent Application, First Publication No. 2001-237174
[Patent Document 2] Japanese Unexamined Patent Application, First Publication No. 2006-228766

DISCLOSURE OF INVENTION

Problems to be Solved by the Invention

The present invention is made in light of the problems described above. An object of the present invention is to provide a reflective photomask and a reflective photomask blank which satisfy various conditions (such as OD, phase difference, reflectance, durability against cleansing liquid, and the like) preferred for a reflective photomask, and can mitigate a shadowing effect which brings about a deterioration phenomenon in the transfer accuracy due to an EUV light.

Means for Solving the Problems

In order to solve the problems described above and to enhance the transfer accuracy by an EUV exposure, inventors of the present invention made repeated deliberations on the materials that are to be used in the low reflection part. As a result, the inventors attained the present invention.

A reflective photomask according to a first embodiment of the present invention reflects an EUV light and is used to irradiate a reflected light to a transfer sample. The reflective photomask includes: a substrate; a high reflection part formed on the substrate; and a patterned low reflection part formed on the high reflection part. Here, the patterned low reflection part includes one layer or plural stacked layers; and at least one layer of the patterned low reflection part includes a layer including Sn and oxygen.

In addition, the reflective photomask may be configured as follows: the layer including the Sn and the oxygen is amorphous (noncrystalline).

In addition, the reflective photomask may be configured as follows: the first layer including the Sn and the oxygen has an atomic ratio of the oxygen with reference to the Sn (O/Sn) greater than or equal to 1.0 and less than or equal to 1.5.

In addition, the reflective photomask may be configured as follows: a film thickness of the patterned low reflection part is greater than or equal to 25 nm and is less than or equal to 45 nm.

In addition, the reflective photomask may be configured as follows: a reflected light from the patterned low reflection part has a phase difference of 175 to 185 degrees with reference to a reflected light from the high reflection part.

In addition, the reflective photomask may be configured as follows: the patterned low reflection part includes two or more layers being stacked; and at least one layer of the patterned low reflection part includes a layer including Ru.

In addition, the reflective photomask may be configured as follows: the layer including the Ru further includes oxygen.

In addition, the reflective photomask may be configured as follows: a reflectance of the patterned low reflection part with reference to an incident ultraviolet ray having a wavelength of 190 nm to 260 nm, is less than or equal to 15%.

In addition, the reflective photomask may be configured as follows: an uppermost layer of the patterned low reflection part is the layer including an Sn and an oxygen.

In addition, the reflective photomask may be configured as follows: an uppermost layer of the patterned low reflection part is a layer including an Si and a nitrogen.

In addition, the reflective photomask may be configured as follows: an uppermost layer of the patterned low reflection part is a layer including an Si and an oxygen.

By the way, a reflective photomask blank according to an aspect of the present invention is used to form a reflective photomask. The reflective photomask blank includes: a substrate; a high reflection part layer formed on the substrate; and a low reflection part layer laminated on the high reflection part layer. Here, the low reflection part layer includes at least one or more layers being stacked, and at least one layer of the low reflection part layer includes a layer including an Sn and an oxygen.

Effects of the Invention

According to the present invention, at least one layer of the low reflection part is a layer including Sn and oxygen. As a result, the low reflection part may be made thinner compared to conventional configurations. Moreover, it is possible to mitigate the shadowing effect.

BRIEF DESCRIPTION OF THE DRAWINGS

FIG. 3 is a table showing a refractive index and an extinction coefficient of various type of materials according to first and fourth embodiments of the present invention in order to compute a reflectance at 13.5 nm, 199 nm, and 257 nm.

FIG. 10 is a table showing a boiling point of a halide of each type of ingredient of an absorption film.

FIG. 20 is a characteristic diagram showing a computation result of a reflectance at a wavelength of 13.5 nm and a phase difference regarding a half tone type reflective photomask and a half tone type reflective photomask blank according to the present invention.

FIG. 21 is a table showing a refractive index with reference to a light having a wavelength of 13.5 nm, and an extinction coefficient, in order to compute a reflectance and a phase difference of a reflection photomask and a reflection photomask blank including an aspect of the present invention.

FIG. 33 is a characteristic diagram showing a computation result of a reflectance at a wavelength of 13.5 nm and a phase difference of a half tone type reflective photomask and a half tone type reflective photomask blank according to the present invention.

EMBODIMENTS FOR CARRYING OUT THE INVENTION

Hereinafter, an effectiveness, suggested by an aspect of the present invention, of using a layer including Sn and oxygen as a low reflection part is described based on a characteristic of a layer including Sn and oxygen. Incidentally, the phrase "include(s)/including Sn and oxygen" in the present Specification refers to a state in which Sn and oxygen have a composition ratio of greater than or equal to 90%.

Figure 1:
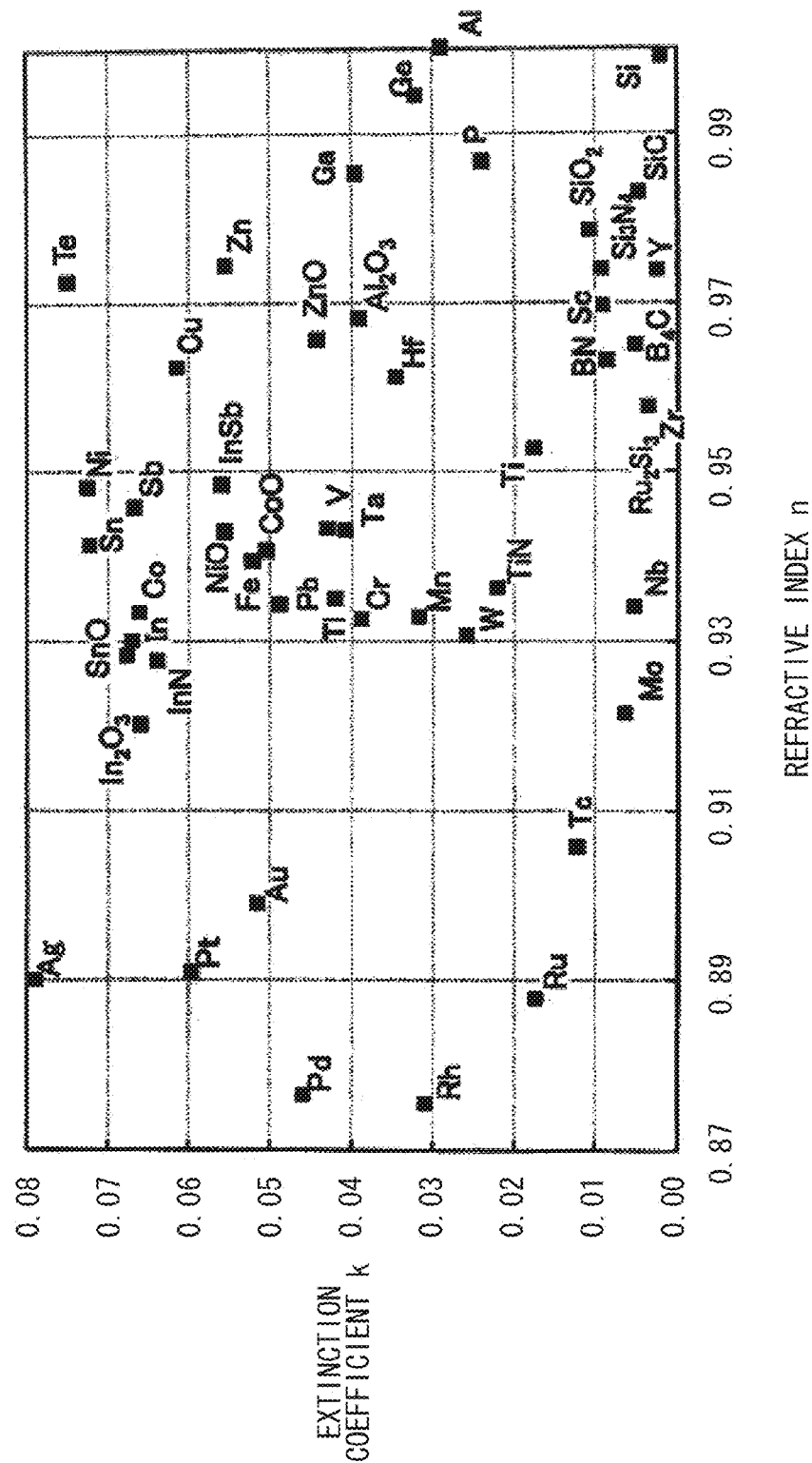
FIG. 1 is a diagram showing a refractive index of a light near a wavelength of 13.5 nm for each type of material, and an extinction coefficient.

As described earlier, in order to mitigate the shadowing effect, the film thickness of a low reflection part, which is a patterned part, may be reduced. In order to reduce the film thickness, first, it is effective to use an absorption film that has a large absorption characteristic with reference to EUV light. In FIG. 1, each documented value of an optical constant for each material at an EUV exposure wavelength (near 13.5 nm) is plotted. The horizontal axis represents the refractive index n. The longitudinal axis represents the extinction coefficient k. Here, from a perspective of optical theory, the greater the extinction coefficient of a film is, the larger the absorption characteristic with reference to an EUV light becomes.

As indicated in FIG. 1, several films have a larger absorption characteristic compared to Ta and Cr, which are conventionally used as a primary ingredient of an absorption film. However, it is rare for an ingredient that may satisfy all of the preferable conditions for a mask ingredient such as the tolerability against acid and alkali cleansing liquid, the suitability for dry etching, and the fine grain characteristic. Among the ingredients shown in FIG. 1, Sn is not preferable from the standpoint of a thermal stability because the melting point of an Sn simple substance is approximately 230° C., which is especially low among the metallic ingredients.

However, in the form of an oxide as tin oxide ($SnO_2$), the melting point becomes greater than or equal to 1000° C. The thermal expansion coefficient of tin oxide is similar to that of normal metallic oxide, is smaller than a normal simple substance, and is stable.

Thus, when an SnO film is actually manufactured, and an optical constant for an EUV wavelength (13.5 nm) is measured, the refractive index was equal to 0.936, and the extinction coefficient was equal to 0.0721. These values are close to the value of SnO indicated in FIG. 1.

Figure 2:
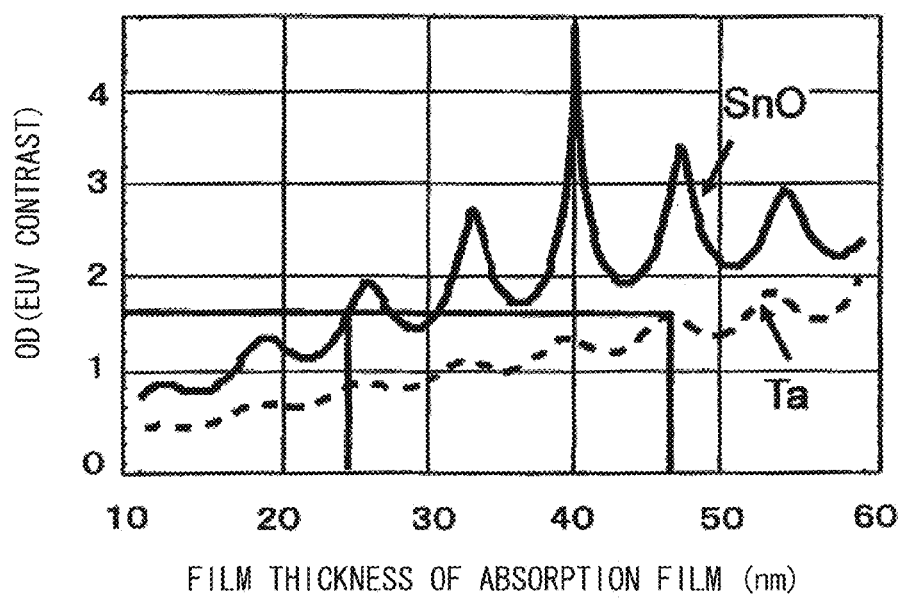
FIG. 2 is a characteristic diagram according to a computed OD value with reference to a film thickness of an absorption film, wherein the absorption film is a Ta and an SnO.

FIG. 2 is created by computing an OD at an EUV wavelength (13.5 nm) using an SnO absorption film based on an optical constant of an SnO film at the EUV wavelength (13.5 nm), and by making a comparison with a Ta film, which is a conventional primary absorption film. This computation is made by presuming that the SnO film or Ta film is a single layer, an Ru dual purpose film with a thickness of 2.5 nm is provided below these films, and 40 pairs of multi-layered reflections film of Si and Mo are provided below the Ru dual purpose film. As shown in FIG. 2, in order to obtain OD>1.5, it is preferable for the thickness of the Ta film to be greater than or equal to 47 nm. Meanwhile, the film thickness of the SnO film may only be 24 nm. In this way, SnO is effective as an absorption film which can reduce the film thickness. Incidentally, the first column of FIG. 3 shows the optical constant at a wavelength of 13.5 nm used in the computation of OD.

The computation in FIG. 2 is made using a dual purpose film for a layer configuration which does not use a buffering film. However, when a defect repair is performed with an FIB, a buffer film is normally used. However, the thickness of a buffer film is usually 10 nm or so, which is thin. The absorption characteristic of EUV light of a buffer film is similar to that of a Ta series or a Cr series film, or less than or equal to that of a Ta series or a Cr series film. Therefore, even in the case of a configuration having a buffer film, an SnO film is still an effective absorption film which can reduce the thickness of an absorption film.

Next, an optical constant of an SnO film at the wavelengths of 199 nm and 257 nm was measured with an ellipsometer. The wavelengths of 199 nm and 257 are standard wavelengths for inspecting a defect. As a result, the following values shown in (3) and (4) below were obtained.

199 nm: Refractive Index=1.87 Extinction Index=0.617 (3)

257 nm: Refractive Index=2.19 Extinction Index=0.341 (4)

Figure 4A:
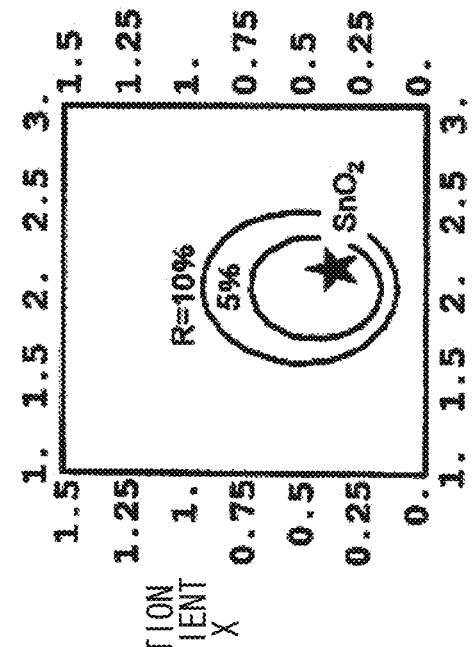
FIG. 4A is a characteristic diagram showing a computation result of a reflectance with reference to a refractive index and an extinction coefficient of an ingredient of an absorption film according to a reflective photomask based on a third embodiment of the present invention.
Figure 4B:
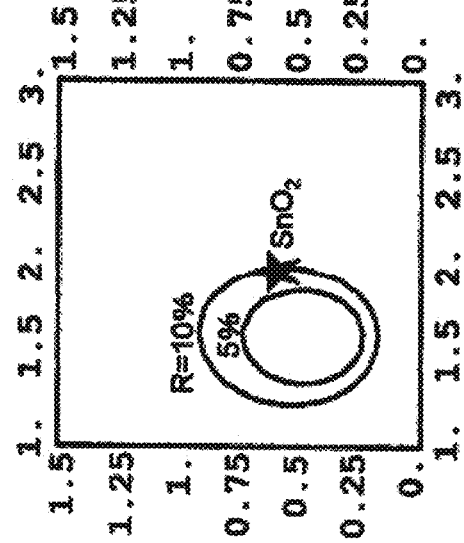
FIG. 4B is a characteristic diagram showing a computation result of a reflectance with reference to a refractive index and an extinction coefficient of an ingredient of an absorption film according to a reflective photomask based on a third embodiment of the present invention.

Here, as described above, when, above the multi-layered reflection film (40 pairs of Si and Mo), above a configuration including an Ru dual purpose film with a thickness of 2.5 nm, an absorption film (referred to tentatively as X) with a thickness of 24 nm obtained in FIG. 2 is provided, a computation result of a contour line at reflectance=10% and 5% with reference to an inspection wavelength is shown in FIG. 4. The horizontal axis represents the refractive index of X. The longitudinal axis represents the extinction coefficient. FIG. 4A shows a case in which the wavelength is 199 nm. FIG. 4B shows a case in which the wavelength is 257 nm. FIGS. 4A and 4B are obtained by plotting the results obtained in (3) and (4) above. When X is SnO, the reflectance at 199 nm becomes approximately 10%, and the reflectance at 257 nm becomes less than or equal to 5%. In other words, according to this configuration, at least near 24 nm, the SnO film becomes sufficiently low-reflective even if an AR film is not used. Thus, it is possible to retain a contrast at the inspection wavelength. Incidentally, wavelength of 199 nm used in the computation, and the optical coefficient at 257 nm are shown in the second and third columns of FIG. 3.

Figure 5:
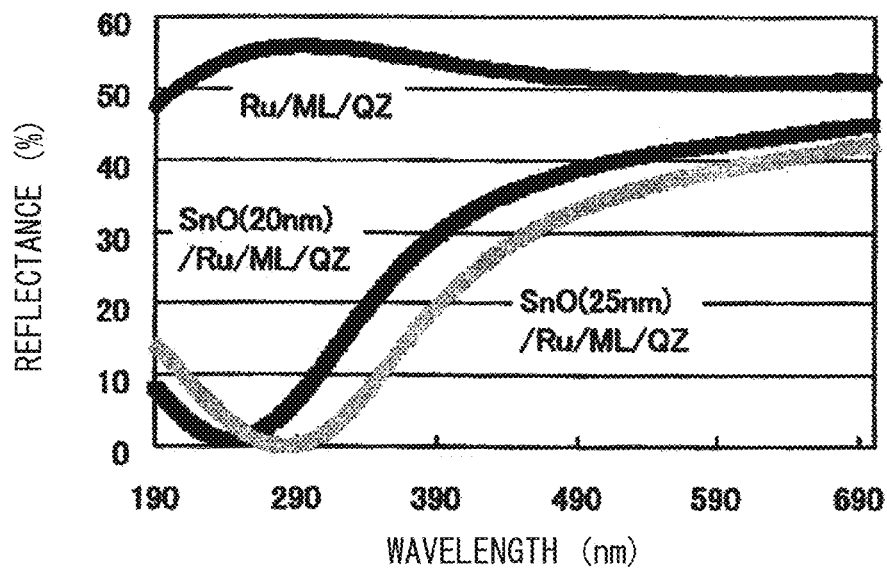
FIG. 5 is a characteristic diagram showing a measurement result of a spectral reflectance of a reflective photomask according to a third embodiment of the present invention.

FIG. 5 shows a spectral reflectance which was actually measured. FIG. 5 shows a spectral reflectance at a state before an SnO film is formed, i.e., a state in which an Ru dual purpose film with a thickness of 2.5 nm is formed above a multi-layered film (40 pairs of Si and Mo, referred to as ML), and a subsequent state in which an SnO film of 20 nm and 25 nm are formed. In this way, after the SnO film is formed, a low reflection is obtained at 199 nm and 257 nm. Hence, the estimate based on the above computations are reasonable.

Figure 6:
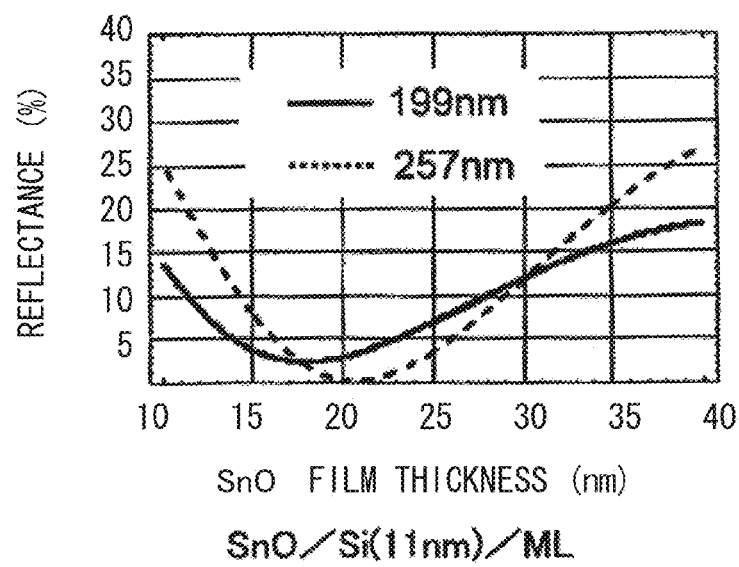
FIG. 6 is a characteristic diagram showing a computation result of a reflectance of a reflective photomask according to a third embodiment of the present invention, computed with reference to an SnO film thickness.
Figure 7A:
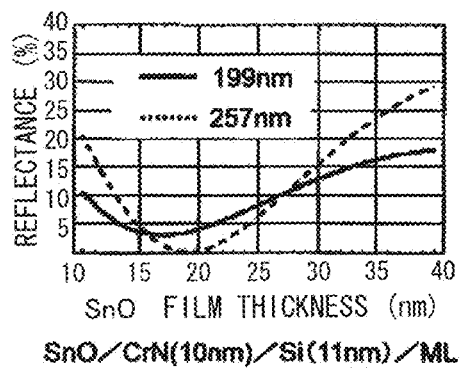
FIG. 7A is a characteristic diagram showing a computation result of a reflectance of a reflective photomask according to a first embodiment of the present invention, computed with reference to an SnO film thickness.
Figure 7B:
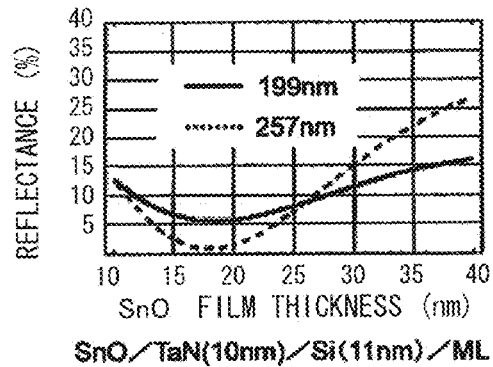
FIG. 7B is a characteristic diagram showing a computation result of a reflectance of a reflective photomask according to a first embodiment of the present invention, computed with reference to an SnO film thickness.
Figure 7C:
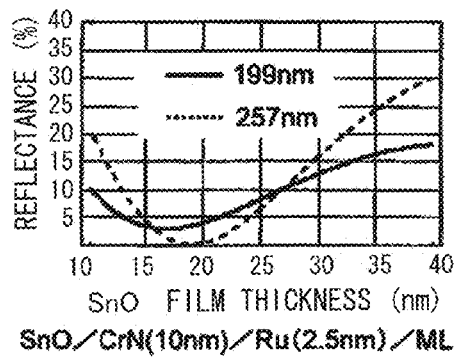
FIG. 7C is a characteristic diagram showing a computation result of a reflectance of a reflective photomask according to a first embodiment of the present invention, computed with reference to an SnO film thickness.
Figure 7D:
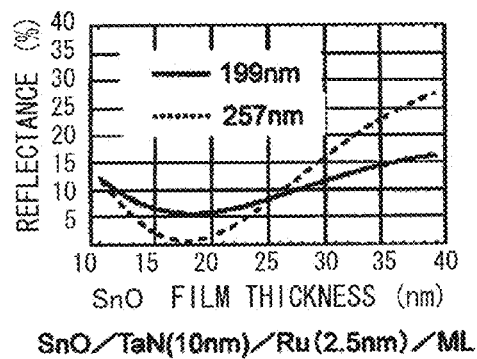
FIG. 7D is a characteristic diagram showing a computation result of a reflectance of a reflective photomask according to a first embodiment of the present invention, computed with reference to an SnO film thickness.

FIG. 6 shows the computation results of a reflectance at 199 nm and 257 nm with reference to an SnO film thickness in a case in which an Si dual purpose film (with a thickness of 11 nm) is used instead of the dual purpose film in FIG. 5. In the case of FIG. 6, a low reflection is adequately achieved at an SnO film thickness of approximately 20 nm to 25 nm, even when an AR film is not used. Therefore, a contrast may be attained at the inspection wavelength.

Furthermore, when a buffering film is used to perform an FIB correction, a low reflection may be attained with an SnO film. FIGS. 7A, 7B, 7C, and 7D shows a case in which a buffer film including TaN or CrN is used between an SnO film and an Si capping film or an Ru capping film. In this way, a low reflection (less than or equal to approximately 15%) is achieved below an SnO film thickness of 30 nm. Thus, it is effective to use an SnO film to achieve a low reflection. Incidentally, columns 2 and 3 of FIG. 3 shows the optical constants of TaN, CrN and the like at the wavelengths of 199 nm and 257 nm, used in the computation.

By the way, FIG. 4 also shows the optical constant of Sn, which is a simple substance metal. However, in this way, Sn is largely separated from the region of the optical constant at which a low reflection is achieved. As the degree of oxidization of Sn becomes greater, the optical constant is supposed to move towards the plotting point of SnO from the point of Sn. In other words, when the degree of oxidization is low, or, even if the degree of oxidization is adequate, when a film thickness of other than 24 nm is to be used in order to change the OD value, or when the SnO film is not the top most layer for some reason, a AR film may be separately used above the SnO film.

Figure 8A:
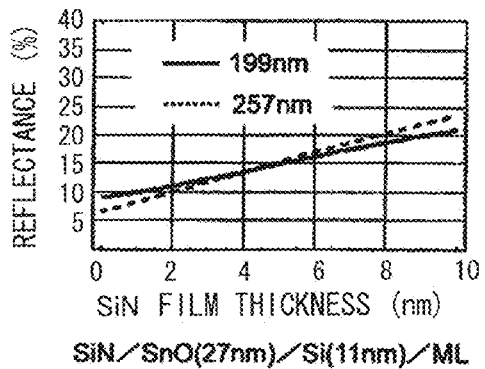
FIG. 8A is a characteristic diagram showing a computation result of a reflectance of a reflective photomask according to a fourth embodiment of the present invention, computed with reference to a thickness of a silicon nitride film.
Figure 8B:
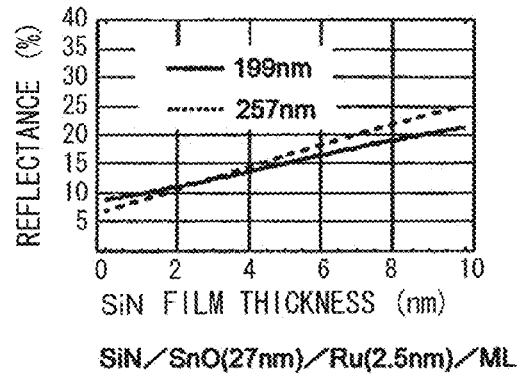
FIG. 8B is a characteristic diagram showing a computation result of a reflectance of a reflective photomask according to a fourth embodiment of the present invention, computed with reference to a thickness of a silicon nitride film.
Figure 9A:
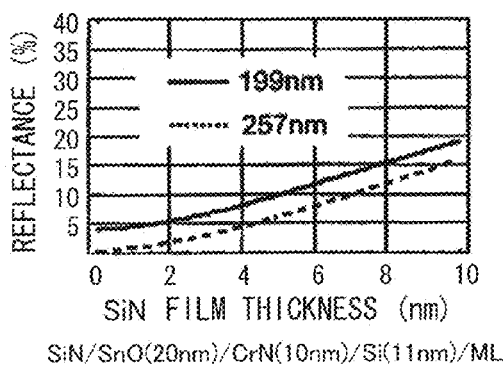
FIG. 9A is a characteristic diagram showing a computation result of a reflectance of a reflective photomask according to a second embodiment of the present invention, computed with reference to a thickness of a silicon nitride film.
Figure 9B:
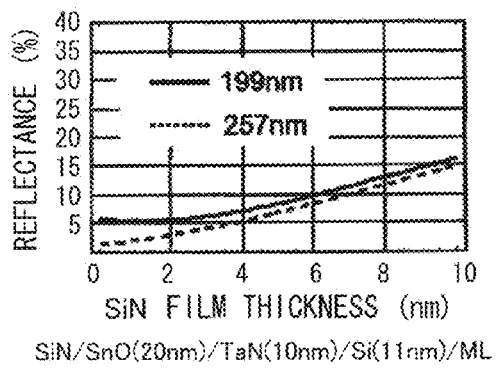
FIG. 9B is a characteristic diagram showing a computation result of a reflectance of a reflective photomask according to a second embodiment of the present invention, computed with reference to a thickness of a silicon nitride film.
Figure 9C:
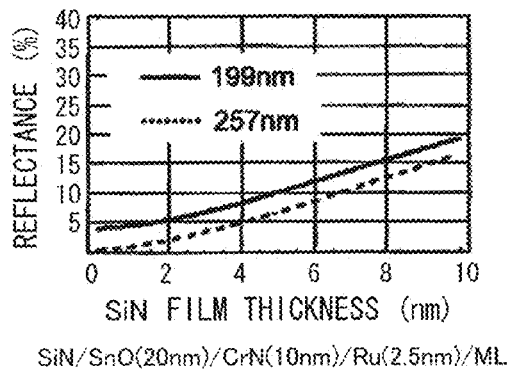
FIG. 9C is a characteristic diagram showing a computation result of a reflectance of a reflective photomask according to a second embodiment of the present invention, computed with reference to a thickness of a silicon nitride film.
Figure 9D:
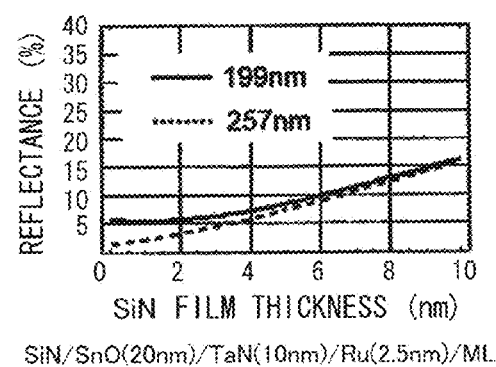
FIG. 9D is a characteristic diagram showing a computation result of a reflectance of a reflective photomask according to a second embodiment of the present invention, computed with reference to a thickness of a silicon nitride film.

FIGS. 8A, 8B and FIGS. 9A, 9B, 9C, and 9D shows the computation result of a reflectance at 199 nm and 257 nm with reference to a silicon nitride film thickness when the AR film at the uppermost layer is a silicon nitride film instead of a dual purpose SnO absorption film. In this way, by using a silicon nitride film having a film thickness of several nm as an AR film above an SnO film, a sufficient low reflection is achieved. Thus, a contrast may be attained at the inspection wavelength. FIGS. 8A and 8B shows a case in which a buffer film is not used. FIGS. 9A, 9B, 9C, and 9D shows a case in which a buffer film is used.

A fluorine type halogen gas or a chlorine type halogen gas is generally used as a dry etching gas of a thin film ingredient. However, the ease with which dry etching is performed may be estimated by comparing the boiling point of the halide of the to-be-dried etched ingredient. In other words, the lower the boiling point is, the more likely that the etching product is gasified and exhausted. FIG. 10 shows a summary of the boiling point of the halide of Sn according to an embodiment of the present invention, and the boiling point of Ta and Cr which are conventional ingredients for an absorption film. (For further details, refer to CRC Handbook of Chemistry and Physics, 78th Edition.) In this way, Ta may be dry-etched with a fluorine type or a chlorine type compound. Cr may be dry-etched with a chlorine type+oxygen type compound. Sn may be dry-etched with a chlorine type compound.

Further, an SnO film is formed on a silica substrate using a sputtering method. The SnO film is immersed for thirty minutes in a conventional cleansing liquid such as APM (NH$_3$: H$_2$O$_2$:H$_2$O=1:2:20, room temperature) and SPM (H$_2$SO$_4$: H$_2$O$_2$=3:1, 100° C.). The durability of the SnO film against the cleansing liquid was evaluated based on the change in the spectral transmittance. As a result, there was no change in the spectral transmittance in the case of APM or SPM. Thus, the SnO film has sufficient durability against cleansing liquids.

Therefore, when at least one layer of the low reflection part is a layer including Sn and oxygen, the low reflection part may be made thinner (more specifically, a thickness of roughly greater than or equal to 25 nm and roughly less than or equal to 45 nm throughout the entire low reflection part) compared to conventional configurations. Thus, the shadowing effect may be mitigated.

Hereinafter, an embodiment of a reflective photomask according to an aspect of the present invention is described. In the description of an embodiment of the present invention, identical constituent components are referred to using the same reference numeral. Moreover, overlapping explanations are omitted.

FIRST EMBODIMENT

Figure 11:
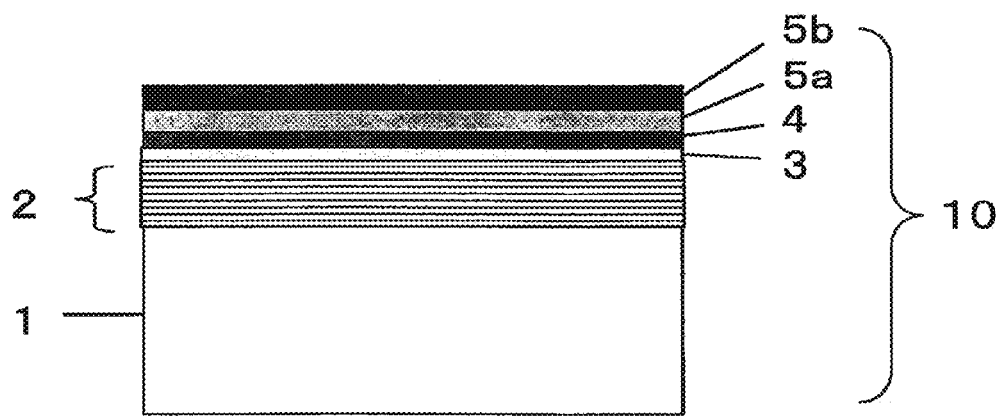
FIG. 11 is a cross sectional schematic diagram showing a configuration of a reflective photomask blank according to a first embodiment of the present invention.

As shown in FIG. 11, a reflective photomask blank 10 according to a first embodiment of the present invention includes a substrate 1, a multi-layered reflection film 2, a capping film 3, a buffer film 4, and absorption films 5a, 5b. The multi-layered reflection film 2 is formed on the substrate 1. The multi-layered reflection film 2 has a high degree of reflection. The capping film 3 is formed on the multi-layered reflection film 2. The capping film 3 protects this multi-layered reflection film 2. The buffer film 4 is formed on the capping film 3. The absorption films 5a, 5b are formed on the buffer film 4. The absorption films 5a, 5b have a low reflectivity. Further, the absorption films 5a, 5b have a multi-layered structure. Here, the upper layer absorption film 5b includes a film having Sn and oxygen as a primary component. Incidentally, as described above, during a mask manufacturing process, a configuration may be made in which the lower layer absorption film 5a acts as the buffer film 4.

For the substrate 1 according to the first embodiment of the present invention, a silicon substrate, a quartz, a low thermal expansion glass with titanium being added, and the like may be used. It is preferable that the ingredient for the substrate 1 be an ingredient with a low thermal expansion rate.

For the multi-layered reflection film 2 according to the first embodiment of the present invention, it is preferable to use a material which can reflect the EUV light used as the exposure light. For example, a laminating body, formed by alternately layering an Mo film and an Si film, may be used. At this time, the multi-layered reflection film 2 may be configured, for example, by stacking 40 pairs of Mo film and Si film, wherein the thickness of one Mo film is 2.8 nm, and the thickness of one Si film is 4.2 nm.

For the capping film 3 according to the first embodiment of the present invention, it is preferable to use a material which can protect the multi-layered reflection film 2, and has transmittance with reference to EUV light. For example, an Si film may be used. An example of such a configuration is an Si film with a thickness of 11 nm.

It is preferable that the buffer film 4 according to the first embodiment of the present invention be formed by a material having a durability against a dry etching which is performed when the pattern of the absorption films 5a, 5b are formed. More specifically, it is preferable that the material forming the buffer film 4 act as an etching stopper which prevents damage to the capping film 3 when the lower layer absorption film 5a is etched. For example, the buffer film 4 may be formed with a CrN film and the like. Incidentally, as described above, depending on the mask manufacturing process, it is possible that the lower layer absorption film 5a act as a buffer film 4.

Figure 12:
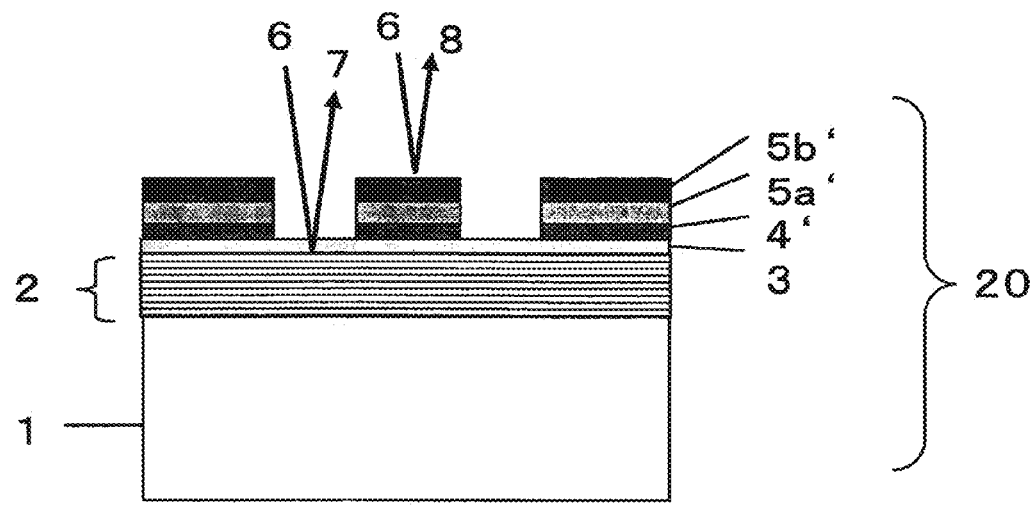
FIG. 12 is a cross sectional schematic diagram showing a configuration of a reflective photomask according to a first embodiment of the present invention.

Next, as shown in FIG. 12, a reflective photomask 20 according to a first embodiment of the present invention includes a substrate 1, a multi-layered reflection film 2, a capping film 3, a buffering film pattern 4', a lower layer absorption film pattern 5a', and an upper layer absorption film pattern 5b'. The multi-layered reflection film 2 is formed above the substrate 1. The multi-layered reflection film 2 has a high degree of reflection. The capping film 3 is formed above the multi-layered reflection film 2. The capping film 3 protects the multi-layered reflection film 2. The buffering film pattern 4' is selectively formed above the capping film 3. The lower layer absorption film pattern 5a' is selectively formed above the buffering film pattern 4'. The upper layer absorption film pattern 5b' is selectively formed above the lower layer absorption film pattern 5a'. Here, the upper layer absorption film pattern 5b' is formed by a film having Sn and oxygen as primary elements. Here, during the mask manufacturing process, the lower layer absorption film 5a may be configured to act as a buffer film 4.

Furthermore, it is preferable that the film having Sn and oxygen has primary elements and forming the upper layer absorption pattern 5b' have a film quality and a thickness such that an AR effect against DUV light occurs, in order to enable a defect inspection with deep-ultraviolet rays (DUV). It is preferred that the film having Sn and oxygen has primary elements and forming the upper layer absorption pattern 5b' have an extinction coefficient of less than or equal to 1.0 with reference to ultraviolet rays over a wavelength of 190 nm to 260 nm.

Furthermore, it is preferable that the film having Sn and oxygen has primary elements and forming the upper layer absorption pattern 5b' have an atomic ratio of oxygen with reference to Sn (O/Sn) that is between 1.0 and 1.5. This is because, when the atomic ratio is between 1.0 and 1.5, the advantages of an absorption film including Sn may be utilized, while the extinction coefficient with reference to an ultraviolet ray at a wavelength between 190 nm to 260 nm is likely to be less than or equal to 1.0.

Moreover, it is preferable that the film having Sn and oxygen has primary elements and forming the upper layer absorption pattern 5b' be amorphous (noncrystalline). This is because, when the film has an amorphous structure, the grain size becomes small, and the flatness and smoothness of the surface becomes well. Furthermore, when the film has an amorphous structure, the film becomes superior in both the mechanical strength and the durability against cleansing liquids. Incidentally, the stoichiometric ratio of SnO is O/Sn=2/1. Therefore, when the atomic ratio O/Sn=1.0 to 1.5, as described above, an amorphous structure is more likely to be obtained.

More preferably, the low reflection part is configured so that the reflectance with reference to an ultraviolet ray at a wavelength between 190 nm and 260 nm is less than or equal to 15%.

SECOND EMBODIMENT

Figure 13:
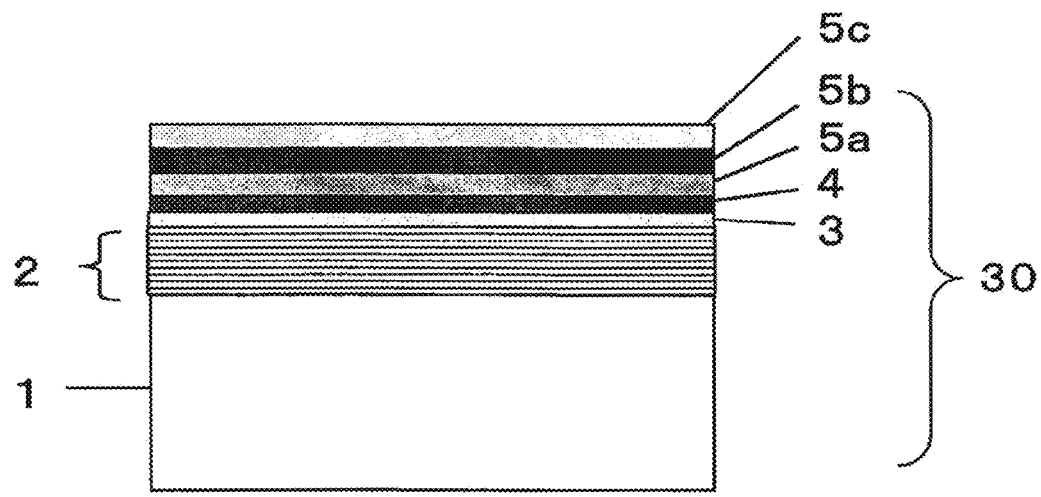
FIG. 13 is a cross sectional schematic diagram showing a configuration of a reflective photomask blank according to a second embodiment of the present invention.

As shown in FIG. 13, a reflective photomask blank 30 according to a second embodiment of the present invention includes a substrate 1, a multi-layered reflection film 2, a capping film 3, a buffer film 4, and absorption films 5a, 5b, and 5c. The multi-layered reflection film 2 is formed on the substrate 1. The multi-layered reflection film 2 has a high degree of reflection. The capping film 3 is formed on the multi-layered reflection film 2. The capping film 3 protects this multi-layered reflection film 2. The buffer film 4 is formed on the capping film 3. The absorption films 5a, 5b, and 5c are formed on the buffer film 4. The absorption films 5a, 5b, and 5c have a low reflectivity. Further, the absorption films 5a, 5b, and 5c have a multi-layered structure. Here, the absorption film 5b includes a film having Sn and oxygen as a primary component. Incidentally, in this case as well, during a mask manufacturing process, a configuration may be made in which the lower layer absorption film 5a acts as the buffer film 4.

For the substrate 1 according to the second embodiment of the present invention, a silicon substrate, a quartz, a low thermal expansion glass with titanium being added, and the like may be used. It is preferable that the ingredient for the substrate 1 be an ingredient with a low thermal expansion rate.

For the multi-layered reflection film 2 according to the second embodiment of the present invention, it is preferable to use a material which can reflect the EUV light used as the exposure light. For example, a laminating body, formed by alternately layering an Mo film and an Si film, may be used. At this time, the multi-layered reflection film 2 may be configured, for example, by stacking 40 pairs of Mo film and Si film, wherein the thickness of one Mo film is 2.8 nm, and the thickness of one Si film is 4.2 nm.

For the capping film 3 according to the second embodiment of the present invention, it is preferable to use a material which can protect the multi-layered reflection film 2. For example, an Si film may be used. An example of such a configuration is an Si film with a thickness of 11 nm.

It is preferable that the buffer film 4 according to the second embodiment of the present invention be formed by a material having a durability against a dry etching which is performed when the pattern of the absorption films 5a, 5b are formed. More specifically, it is preferable that the material forming the buffer film 4 act as an etching stopper which prevents damage to the capping film 3 when the lower layer absorption film 5a is etched. For example, the buffer film 4 may be formed with a CrN film and the like. Incidentally, as described above, depending on the mask manufacturing process, it is possible that the lower layer absorption film 5a act as a buffer film 4.

Figure 14:
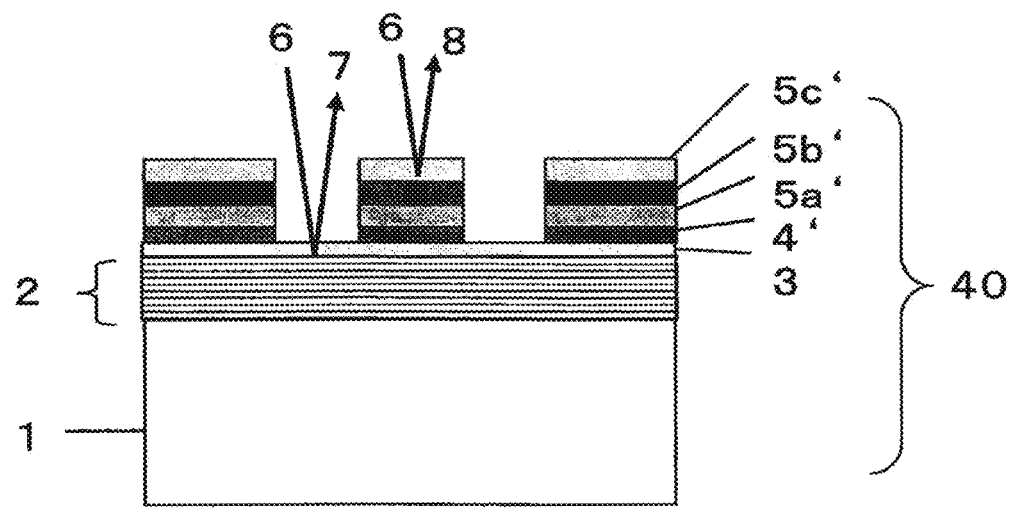
FIG. 14 is a cross sectional schematic diagram showing a configuration of a reflective photomask according to a second embodiment of the present invention.

Next, as shown in FIG. 14, a reflective photomask 40 according to a second embodiment of the present invention includes a substrate 1, a multi-layered reflection film 2, a capping film 3, a buffering film pattern 4', a lower layer absorption film pattern 5a', an upper layer absorption film pattern 5b', and an anti-reflection film pattern 5c'. The multi-layered reflection film 2 is formed above the substrate 1. The multi-layered reflection film 2 has a high degree of reflection. The capping film 3 is formed above the multi-layered reflection film 2. The capping film 3 protects the multi-layered reflection film 2. The buffering film pattern 4' is selectively formed above the capping film 3. The lower layer absorption film pattern 5a' is selectively formed above the buffering film pattern 4'. The upper layer absorption film pattern 5b' is selectively formed above the lower layer absorption film pattern 5a'. The reflection-preventing absorption film pattern 5c' is selectively formed above the upper layer absorption film pattern 5b'. Here, the upper layer absorption film pattern 5b' is formed by a film having Sn and oxygen as primary elements. Here, during the mask manufacturing process, the lower layer absorption film 5a may be configured to act as a buffer film 4.

Here, the upper layer absorption film pattern 5b' is formed by a film having Sn and oxygen as a primary element. The reflection-preventing absorption film pattern 5c' is formed by a film having Si and nitrogen, or Si and oxygen as primary elements. The low reflection part includes the upper layer absorption film pattern 5b', the lower layer absorption film pattern 5a', and the anti-reflection film pattern 5c'. Preferably, the low reflection part is configured so that the reflectance with reference to an ultraviolet ray at a wavelength between 190 nm and 260 nm is less than or equal to 15%.

THIRD EMBODIMENT

Figure 15:
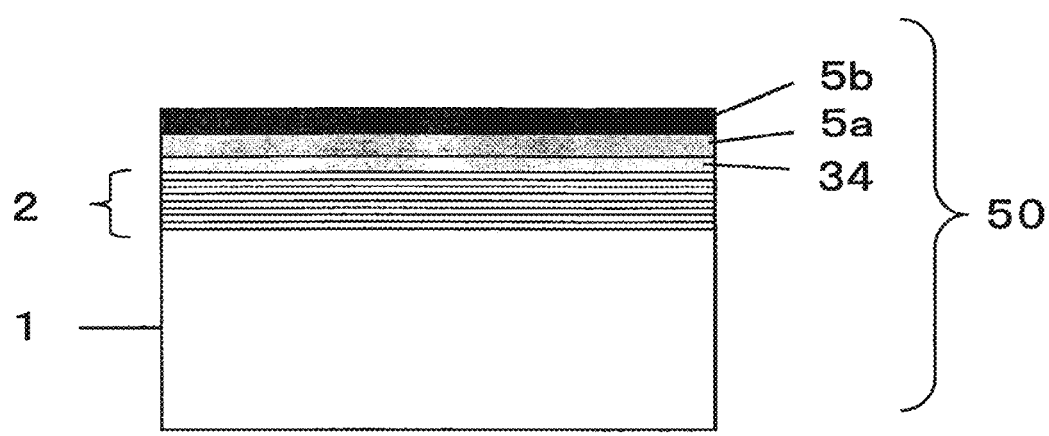
FIG. 15 is a cross sectional schematic diagram showing a configuration of a reflective photomask blank according to a third embodiment of the present invention.

FIG. 15 shows a reflective photomask blank 50 according to a third embodiment of the present invention. The dual purpose film 34 is the difference between the reflective photomask blank 10 according to the first embodiment of the present invention shown in FIG. 11 and the reflective photomask blank according to the third embodiment of the present invention shown in FIG. 15. The descriptions other than those related to the dual purpose film 34 are omitted because they overlap with the descriptions considering the first embodiment.

The dual purpose film 34 is provided between the lower layer absorption film 5a and the multi-layered reflection film 2. The dual purpose film 34 act as both the capping film 3 and the buffer film 4 described in the first embodiment. The capping film 3 protects the multi-layered reflection film 2. An Si film and a silicon nitride film may be used as ingredients of the dual purpose film 34. However, the present invention is not limited to this configuration.

Figure 16:
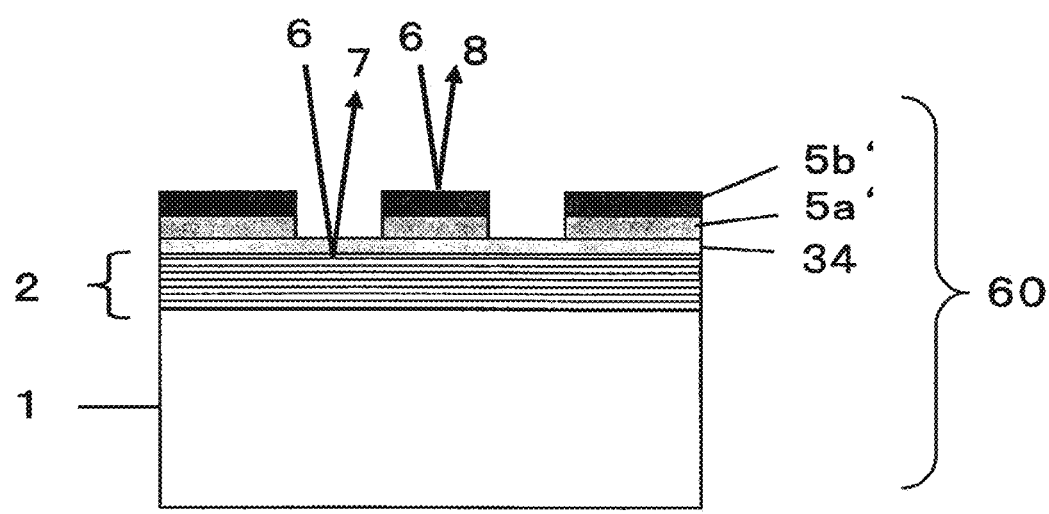
FIG. 16 is a cross sectional schematic diagram showing a configuration of a reflective photomask according to a third embodiment of the present invention.

Next, FIG. 16 shows a reflective photomask 60 according to a third embodiment of the present invention. The dual purpose film 34 is the difference between the reflective photomask 20 according to the first embodiment of the present invention and the reflective photomask according to the third embodiment of the present invention shown in FIG. 16. According to the configuration shown in FIG. 16, the dual purpose film 34 is provided between the lower layer absorption film pattern 5a' and the multi-layered reflection film 2. The descriptions of each ingredient are omitted because they overlap with those of the first embodiment.

FOURTH EMBODIMENT

Figure 17:
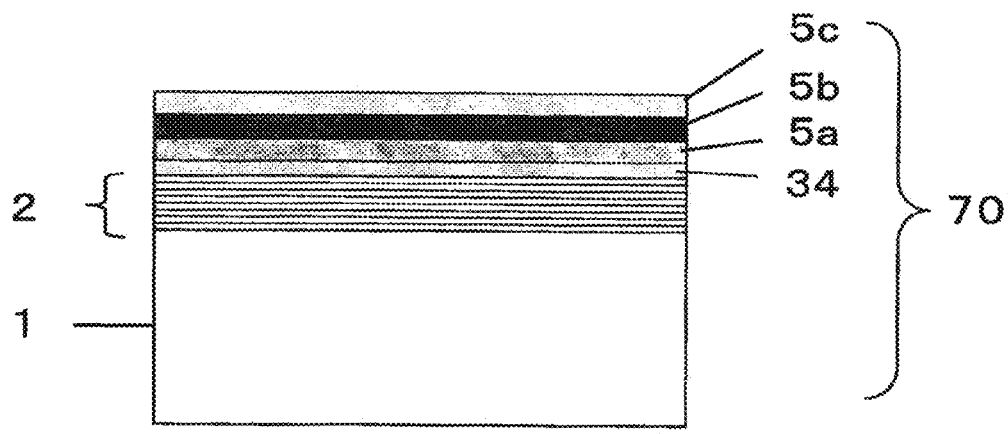
FIG. 17 is a cross sectional schematic diagram showing a configuration of a reflective photomask blank according to a fourth embodiment of the present invention.

FIG. 17 shows a reflective photomask blank 70 according to a fourth embodiment of the present invention. The dual purpose film 34 is the difference between the reflective photomask blank 30 according to the second embodiment of the present invention shown in FIG. 13 and the reflective photomask blank according to the fourth embodiment of the present invention shown in FIG. 17. The following description describes this dual purpose film 34. The descriptions other than those related to the dual purpose film 34 are omitted because they overlap with the descriptions considering the second embodiment.

The dual purpose film 34 is provided between the lower layer absorption film 5a and the multi-layered reflection film 2. The dual purpose film 34 act as both the capping film 3 and the buffer film 4 described in the second embodiment. The capping film 3 protects the multi-layered reflection film 2. An Si film and a silicon nitride film may be used as ingredients of the dual purpose film 34. However, the present invention is not limited to this configuration.

Figure 18:
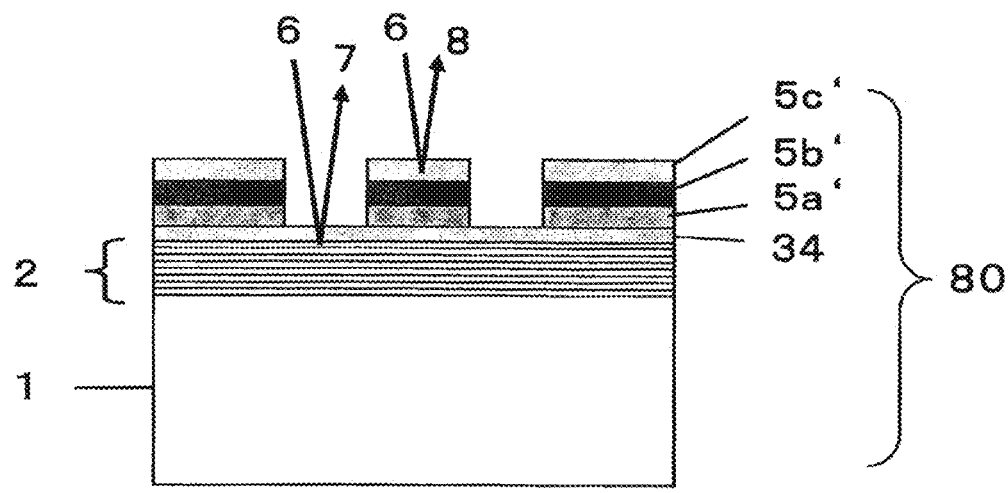
FIG. 18 is a cross sectional schematic diagram showing a configuration of a reflective photomask according to a fourth embodiment of the present invention.

Next, FIG. 18 shows a reflective photomask 80 according to a fourth embodiment of the present invention. The dual purpose film 34 is the difference between the reflective photomask 40 according to the second embodiment of the present invention and the reflective photomask according to the fourth embodiment of the present invention shown in FIG. 18.

According to the configuration shown in FIG. 16, the dual purpose film 34 is provided between the lower layer absorption film pattern 5a' and the multi-layered reflection film 2. The descriptions of each ingredient are omitted because they overlap with those of the second embodiment.

Hereinafter, a half tone type reflective photomask according to the first, second, third, and fourth embodiments of the present invention is described. First, a low reflection light 8 has a phase difference of 175 degrees to 185 degrees with reference to a high reflection light 7. Furthermore, a lower layer absorption film pattern 5a' (a lower layer absorption film 5a in a blank state) includes a film having Ru or Ru and oxygen as primary elements. Here, the term "primary" means that the total composition ratio of the "primary elements" is greater than or equal to 90%.

In FIGS. 16 and 18, when a lower layer absorption film pattern 5a' and an upper layer absorption film pattern 5b' exists, and in FIGS. 12 and 14, when a buffering film pattern 4' exists, the buffer film pattern 4' acts as a film diminishing an EUV incident light 6, in addition to the absorption film pattern. At the same time, the buffer film pattern 4' also acts as a film which creates a phase difference between a high reflection light 7 and a low reflection light 8. Furthermore, the upper layer absorption film pattern 5b' in FIGS. 12 and 16, and the pattern 5c' of an anti-reflection film in FIGS. 14 and 18 act as an AR film with reference to the DUV light for inspection.

Next, a selection of a constituent element of a lower layer absorption film 5a, an upper layer absorption film 5b, and an anti-reflection film 5c according to the first, second, third, and fourth embodiments of the present invention is described. Incidentally, the lower layer absorption film 5a and the upper layer absorption film 5b are simply referred to as an "absorption film."

According to a half tone type reflective photomask, in order to obtain a preferable reflectance of 4% to 15%, it is preferable to use an absorption film with transparency (half tone film), compared to a conventional absorption film of a binary type reflective photomask represented by TaN, TaSi, and TaBN. In order to simply enhance the transparency, the film thickness of the absorption film may be reduced. However, when the film thickness decreases, it becomes difficult to obtain a phase difference of 175 to 185 degrees with reference to a high reflection light. In order to retain the phase difference even when the film thickness becomes small, it is preferable to use a film material which has as small a refractive index as possible (far from vacuum part=1) in an EUV exposure wavelength.

Figure 19:
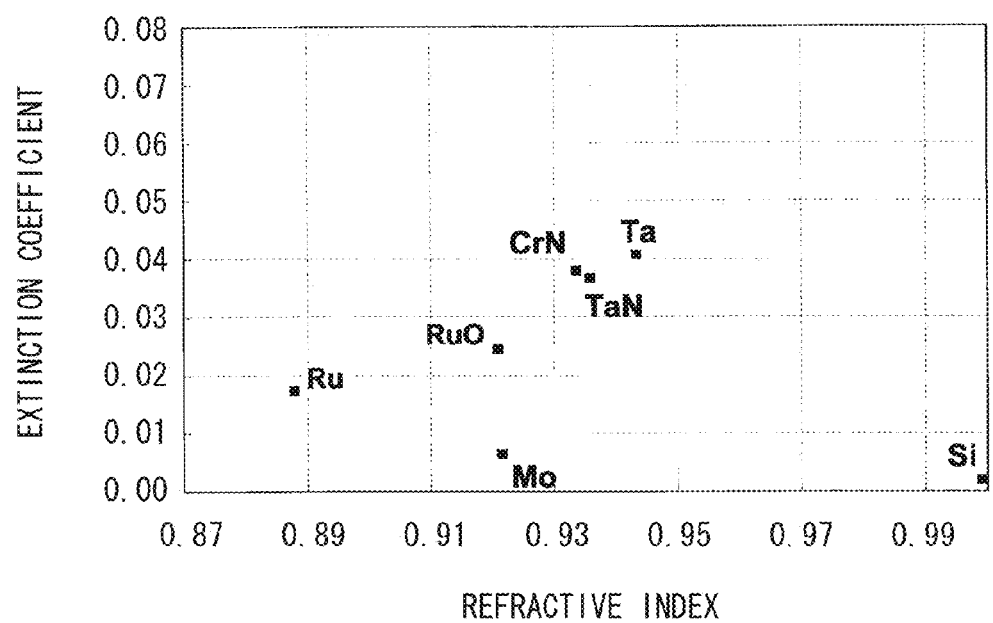
FIG. 19 is a characteristic diagram showing a reflectance with reference to a light with a wavelength of 13.5 nm, and an extinction coefficient, of an ingredient of a reflection photomask and a reflection photomask blank.
Figure 22:
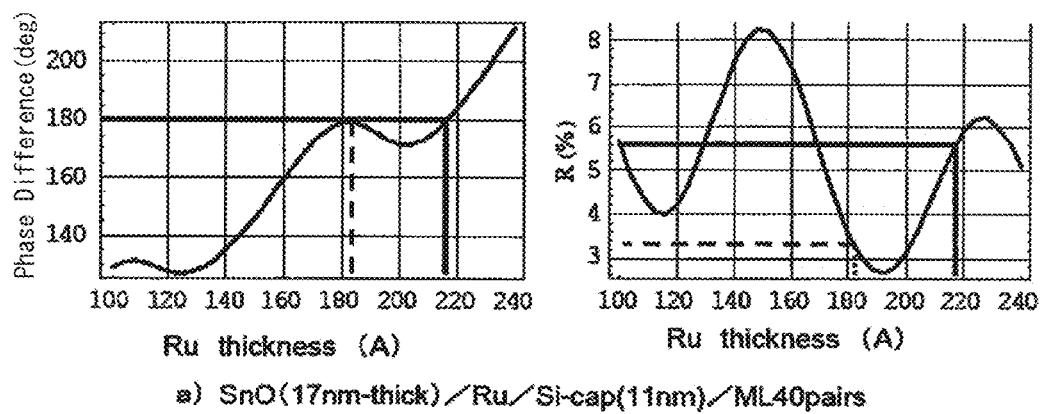
FIG. 22 is a characteristic diagram showing a computation result of a reflectance at a wavelength of 13.5 nm and a phase difference of a half tone type reflective photomask and a half tone type reflective photomask blank according to an aspect of the present invention.
Figure 23:
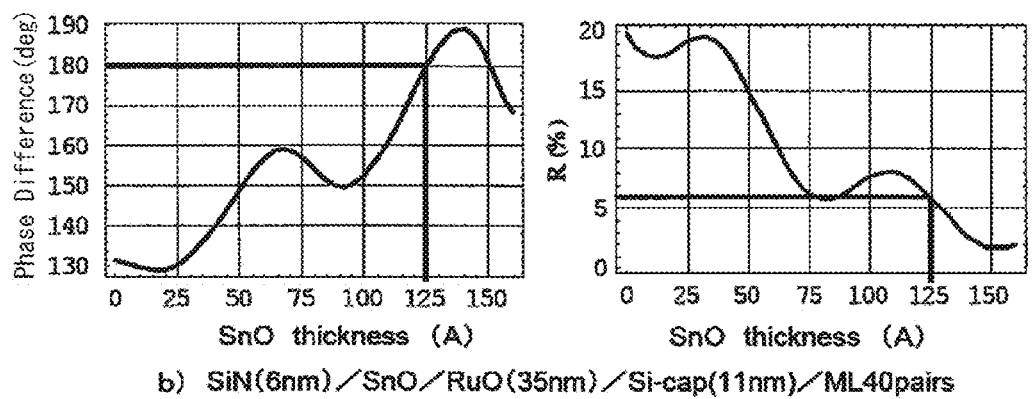
FIG. 23 is a characteristic diagram showing a computation result of a reflectance at a wavelength of 13.5 nm and a phase difference of a half tone type reflective photomask and a half tone type reflective photomask blank according to an aspect of the present invention.
Figure 24:
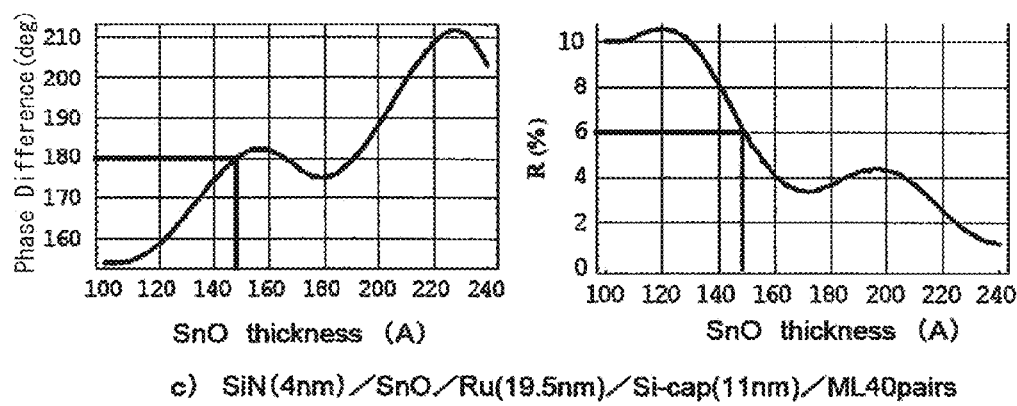
FIG. 24 is a characteristic diagram showing a computation result of a reflectance at a wavelength of 13.5 nm and a phase difference of a half tone type reflective photomask and a half tone type reflective photomask blank according to an aspect of the present invention.
Figure 25:
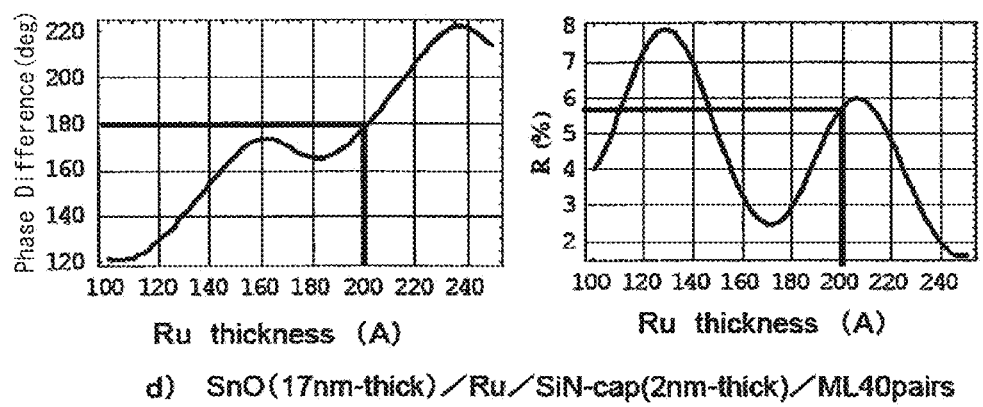
FIG. 25 is a characteristic diagram showing a computation result of a reflectance at a wavelength of 13.5 nm and a phase difference of a half tone type reflective photomask and a half tone type reflective photomask blank according to an aspect of the present invention.
Figure 26:
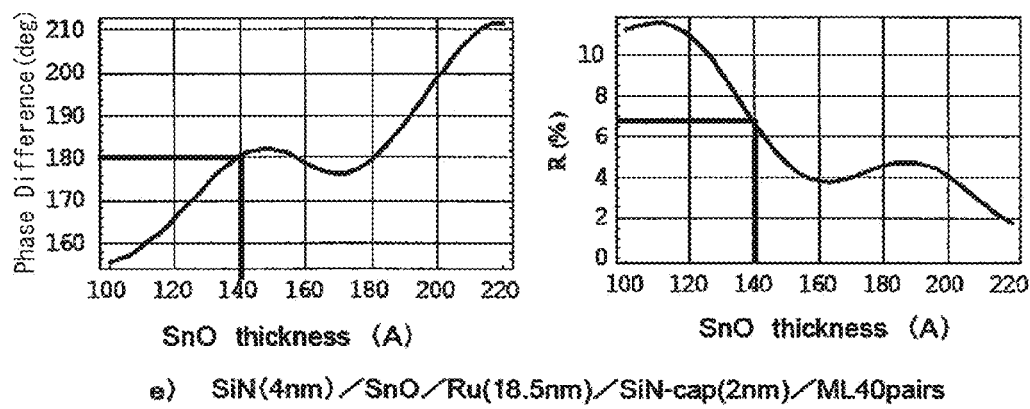
FIG. 26 is a characteristic diagram showing a computation result of a reflectance at a wavelength of 13.5 nm and a phase difference of a half tone type reflective photomask and a half tone type reflective photomask blank according to an aspect of the present invention.
Figure 27:
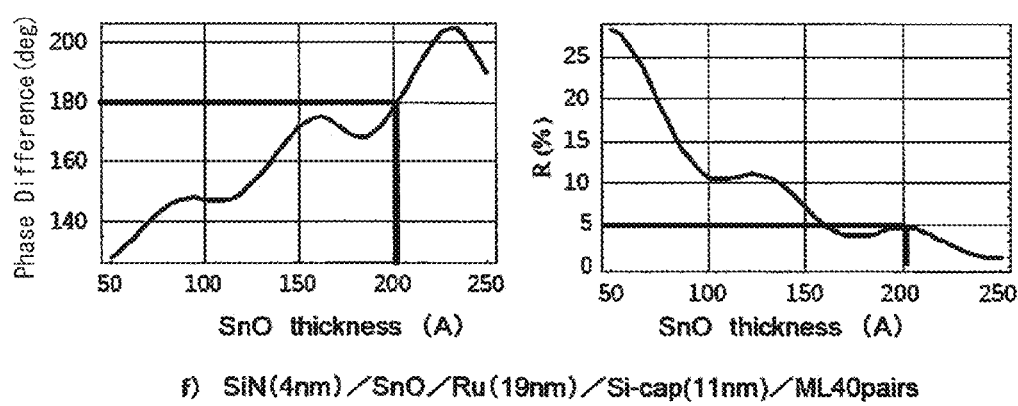
FIG. 27 is a characteristic diagram showing a computation result of a reflectance at a wavelength of 13.5 nm and a phase difference of a half tone type reflective photomask and a half tone type reflective photomask blank according to an aspect of the present invention.
Figure 28:
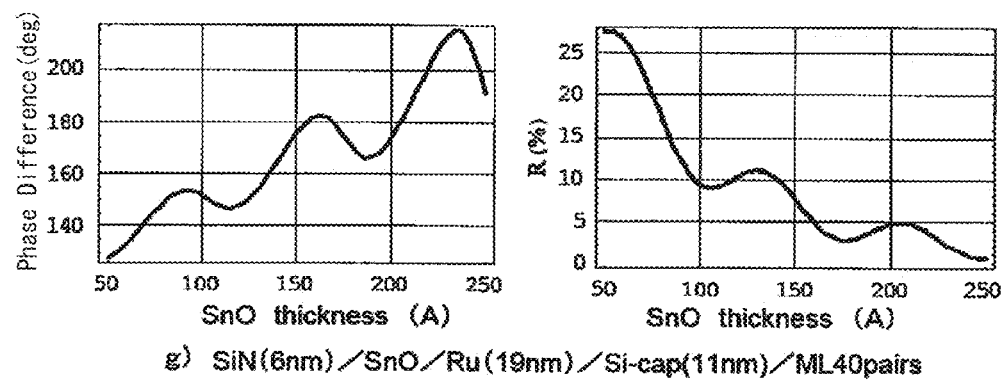
FIG. 28 is a characteristic diagram showing a computation result of a reflectance at a wavelength of 13.5 nm and a phase difference of a half tone type reflective photomask and a half tone type reflective photomask blank according to an aspect of the present invention.
Figure 29:
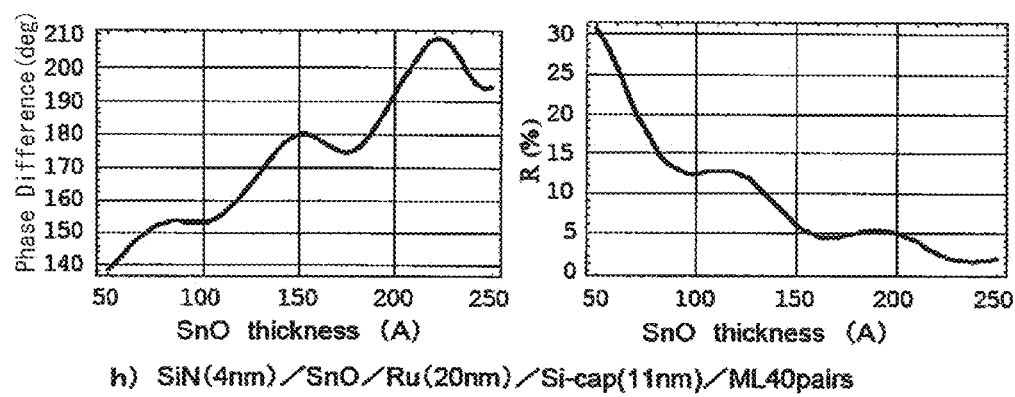
FIG. 29 is a characteristic diagram showing a computation result of a reflectance at a wavelength of 13.5 nm and a phase difference of a half tone type reflective photomask and a half tone type reflective photomask blank according to an aspect of the present invention.
Figure 30:
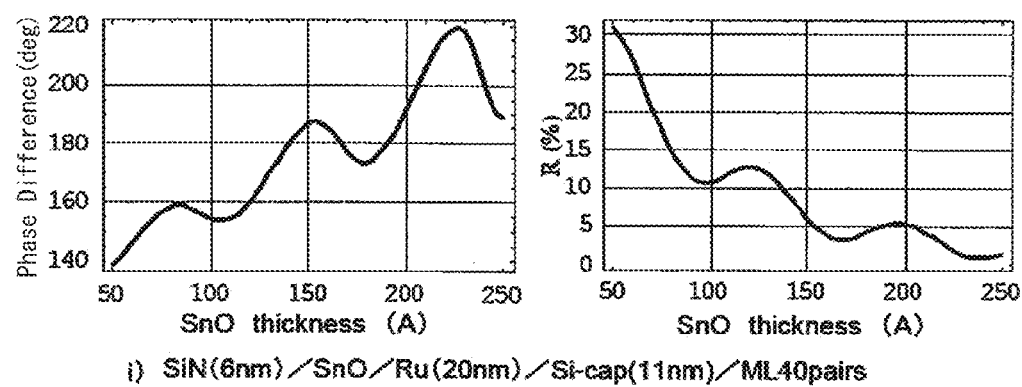
FIG. 30 is a characteristic diagram showing a computation result of a reflectance at a wavelength of 13.5 nm and a phase difference of a half tone type reflective photomask and a half tone type reflective photomask blank according to an aspect of the present invention.
Figure 31:
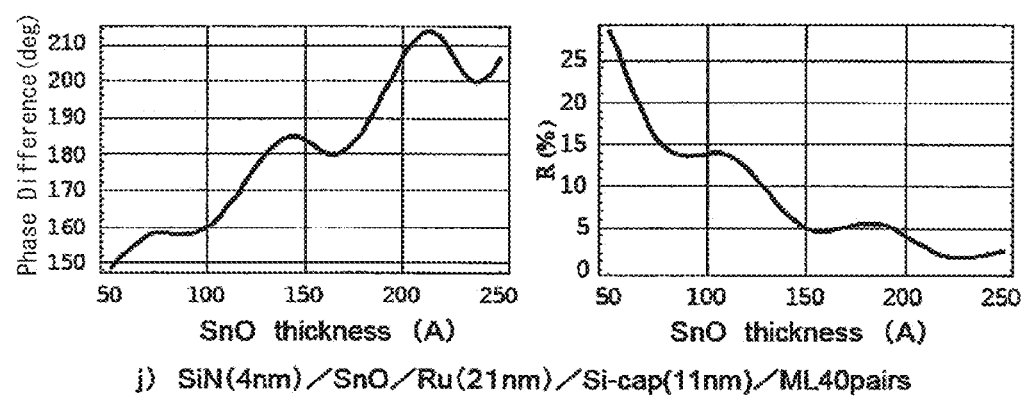
FIG. 31 is a characteristic diagram showing a computation result of a reflectance at a wavelength of 13.5 nm and a phase difference of a half tone type reflective photomask and a half tone type reflective photomask blank according to an aspect of the present invention.
Figure 32:
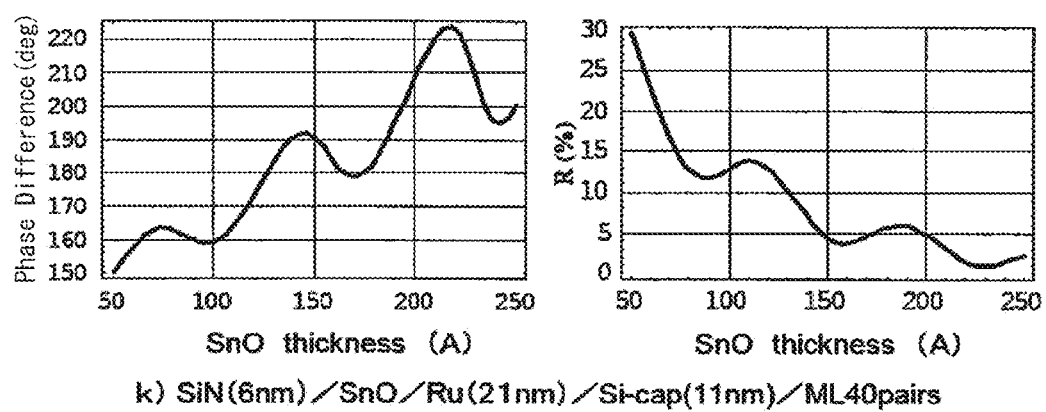
FIG. 32 is a characteristic diagram showing a computation result of a reflectance at a wavelength of 13.5 nm and a phase difference of a half tone type reflective photomask and a half tone type reflective photomask blank according to an aspect of the present invention.

FIG. 19 shows the optical constant of each material at an EUV exposure wavelength (13.5 nm). A plot is being made on FIG. 19, wherein the horizontal axis represents the refractive index: n, and a longitudinal axis represents the extinction coefficient: k. Mo is a representative example of an ingredient having high transmittance and a low refractive index. However, Mo has a weak durability with reference to a chemical liquid such as a cleansing liquid. Further, as is indicated from the fact that Mo is used as an ingredient for the multi-layered reflection film 2, Mo in its simple substance form is not suitable for an ingredient of an absorption film because the transparency of Mo is too high.

Ru is an ingredient having a small refractive index in an EUV wavelength. The Ru also has a high durability with reference to acid and alkali cleansing liquid. Therefore, Ru is a material which may become an ingredient of a half tone film of a reflective photomask. Furthermore, since the refractive index is small, it is possible to reduce the film thickness for attaining a phase difference of 180 degrees. However, since the film thickness is small, the transparency increases. Therefore, the reflectance becomes exceedingly higher than the values which are favorable for a half tone mask.

Therefore, in order to reduce the reflectance of the reflection photomask with reference to an EUV light to the values which are favorable for a half tone mask, an Ru type film may be combined with a Ta type film or a Cr type film which are normally used as an absorption film. A Ta type thin film has been conventionally used as an equal magnification X ray mask. A Cr type thin film has been used as an ingredient of a transparent type photomask. Since there are not problems on the durability against chemical liquids, it is preferable from the standpoint of the suitability with the mask manufacturing line.

FIG. 20 shows a combination of a film thickness which allows the phase difference to be 180 degrees, as well as a computation result of a reflectance (a relative reflectance with reference to a high reflection part) at that time. Here, an Ru type film is used as an upper layer absorption film. A Ta type film or a Cr type film is used as a lower layer absorption film (or a buffer film, depending on the process). In addition, an anti-reflection film according to a silicon nitride film is used. Furthermore, a dual purpose film (or a capping film, depending on the process) according to an Si film or an Ru film is used.

FIG. 21 shows the optical constant of the ingredients used in the computation, at a standard EUV exposure light wavelength of 13.5 nm. Among these ingredients, TaSi is a film obtained by adding to Ta, an Si for approximately several %.

In general, a TaSiO film and the like may be used for the anti-reflection film 5c. However, in this case, a silicon nitride film is used for ease of forming the film (the film may be formed by using Si as a target, and performing a sputtering with a compound gas of Ar and $N_2$). The film thickness of the anti-reflection film 5c is a film thickness (approximately 16 nm) such that a low reflection is achieved at a defect inspecting wavelength of 257 nm and 199 nm, when each of the upper layer absorption film 5b and the lower layer absorption film 5a is laminated.

According to the computation in FIG. 20, the film thickness of Mo and Si included in the multi-layered reflection film 2 is respectively 2.8 nm and 4.2 nm. The multi-layered reflection film includes 40 pairs of Mo/Si. Further, in a case in which an Si film and an Ru film are used as a dual purpose film (or a capping film, depending on the process), the film thickness of the Si film and the Ru film is respectively 11 nm and 2.5 nm. These film thicknesses are used in a conventional binary type reflective photomask.

According to FIG. 20, it is possible to manufacture a half tone type reflective photomask with a phase difference of approximately 180 degrees and having an appropriate reflectance according to exposure conditions, by appropriately altering the film thickness of each layer of a reflective photomask of various configurations.

However, FIG. 20 indicates that the total film thickness of a portion that becomes a pattern will not become less than or equal to 50 nm if a combination is made with an Ru film and a Ta type film or a Cr type film. This configuration does not have a thin film thickness compared to a reflective photomask which is currently suggested. Thus, in order to reduce the position deviation of a pattern due to a shadowing effect, a further reduction in the film thickness is preferred.

Therefore, a combination is made with Ru and an SnO film. This SnO film has a greater EUV light absorbing characteristic compared to a Ta type film or a Cr type film. The SnO is used for the upper layer absorption film. The Ru type film is used for the lower layer absorption film. FIGS. 22 to 32 show combinations of film thicknesses which allow the phase difference to be 180 degrees, as well as the computation result of a reflectance (a relative reflectance with reference to a high reflection part) at that time. Incidentally, in FIGS. 22 to 32, ML refers to a multi-layered reflection film (Multi-Layer). FIG. 21 shows a measurement result of an optical constant of an SnO film, used in the computation, at a standard EUV exposure light wavelength of 13.5 nm. FIG. 33 shows a summary of the results of FIGS. 22 to 32. Incidentally, according to FIG. 33, the lower layer absorption film becomes a buffer film, or the capping film becomes a dual purpose film, depending on the manufacturing process. However, the final configuration of the mask is the same.

Figure 34:
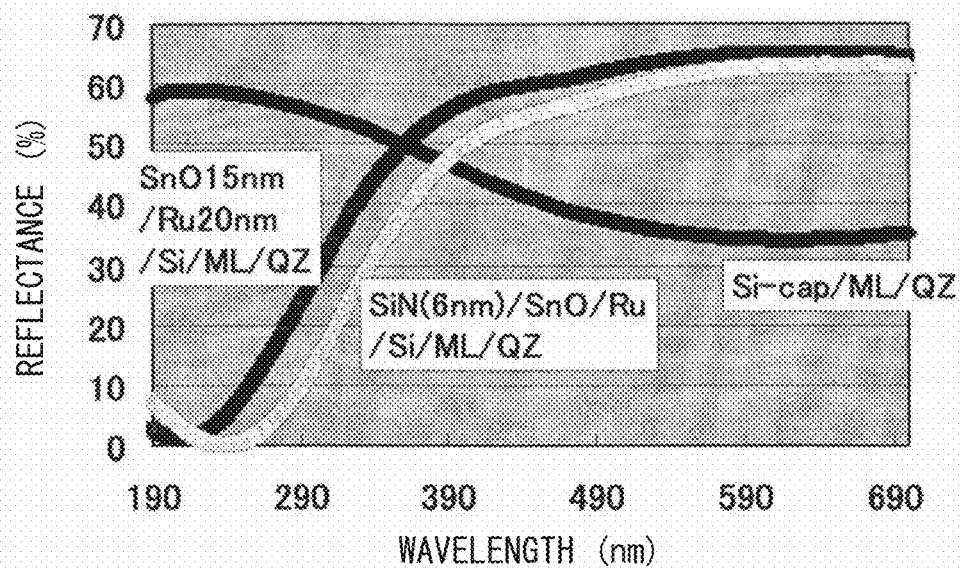
FIG. 34 is a diagram showing a measurement result of a spectral reflectance for each manufacturing step of an EUV half tone mask blank according to the present invention.

Hereinafter, a description is provided concerning whether or not an anti-reflection film is present and concerning the film thickness in the computation from FIG. 22 to FIG. 32. FIG. 34 shows a measurement result of a spectral reflectance during a manufacturing step of an EUV half tone mask blank according to the present invention. Each of the representation in FIG. 34 shows the spectral reflectance of a condition in which 40 pairs of multi-layered reflection film (ML) and an Si capping film with a thickness of 11 nm are present; a condition in which, on top of this, an Ru film with a film thickness of 20 nm and an SnO film with a film thickness of 15 nm are formed; and a condition in which, further on top of this, a silicon nitride film with a film thickness of 6 nm is formed. A commonly used wavelength in the defect inspection is 190 nm to 260 nm of ultraviolet ray. However, as is shown in FIG. 34, an SnO film, which is originally an absorption film, has a substantial degree of transparency in this region of ultraviolet ray. As a result, at the stage when the SnO film is provided, the reflectance is already low to a preferable degree. Further, when a silicone nitride film having a film thickness of 6 nm is formed, the bottom value of the reflectance moves somewhat to the longer wavelength side, although a low reflectance is still maintained in the inspection wavelength region. In this way, it is not necessary to form an anti-reflection film on the SnO film in order to reduce the reflectance at the inspection wavelength. However, forming an anti-reflection film on the SnO film is effective for adjusting the reflectance, or for providing a protection film for the absorption film of the upper layer.

As described above, an SnO film has a relatively high degree of transparency at inspection wavelength. As a result, as an AR film on the SnO film, a silicon nitride film or a silicon oxide film are effective as a film having a transparency higher than an SnO film. Further, in general, a silicon oxide film has a smaller refractive index and a higher degree of transparency compared to a silicon nitride film. Therefore, compared to a silicon nitride film, a silicon oxide film is more effective as an AR film of an SnO film, having greater transparency (i.e., higher degree of oxidization of SnO film).

WORKING EXAMPLES

Hereinafter, working examples of a reflective photomask according to the present invention are described. In particular, working examples of a half tone type reflective photomask and a reflective photomask blank are described.

Working Example 1

Manufacturing of a Reflective Photomask Blank

First, a multi-layered reflection film including 40 pairs of Mo (with a thickness of 2.8 nm) and Si (with a thickness of 4.2 nm) was formed on a low thermal expansion glass substrate using an ion beam sputtering method. Further, on top of this, a capping film having a thickness of 11 nm including Si was formed using a magnetron sputtering method. Thus, a measurement of an EUV reflectance was performed for a high reflection part.

Next, on top of the capping film, an Ru film having a thickness of 19.5 nm was formed. Here, Ru was the target. A magnetron sputtering method was used in which an Ar gas is discharged.

Next, on top of the Ru film, an SnO film having a thickness of 14.7 nm was formed. Here, Sn was the target. A magnetron sputtering method was used in which an oxygen gas was added to the Ar gas.

Next, on top of the SnO film, a silicone nitride film having a thickness of 4 nm is formed as an anti-reflection film. Here, Si was the target. A magnetron sputtering method was used in which nitrogen was added to the Ar gas.

In this way, a half tone type reflective photomask blank according to the present invention was manufactured.

A measurement of an EUV reflectance of a low reflection part (half tone part) was performed for the half tone type reflective photomask blank manufactured as described above. The reflectance was approximately 6.0% with reference to a high reflection part. Thus, the reflectance was a preferable value for a half tone type mask. Further, a measurement of a spectral reflectance was performed. As a result, the spectral reflectance was less than or equal to 10% in the wavelength range of 190 nm to 260 nm used in a defect inspection. Thus, a sufficient low reflection was achieved.

Evaluation of an SnO Film of a Reflective Photomask Blank according to Working Example 1

Figure 35:
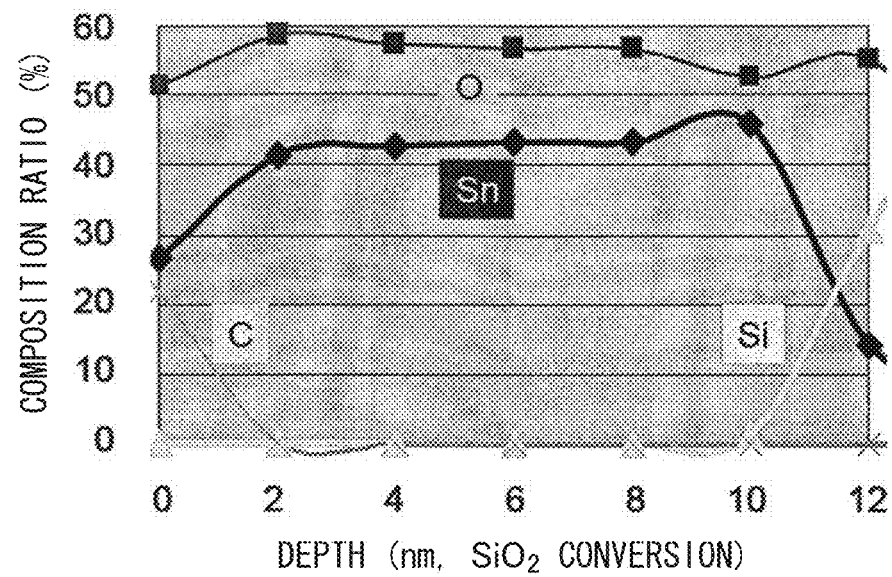
FIG. 35 is a characteristic diagram showing a result of an analysis of a composition ratio of an SnO film according to a working example of the present invention, the analysis being made with an X-ray photoelectron spectroscopy.
Figure 36:
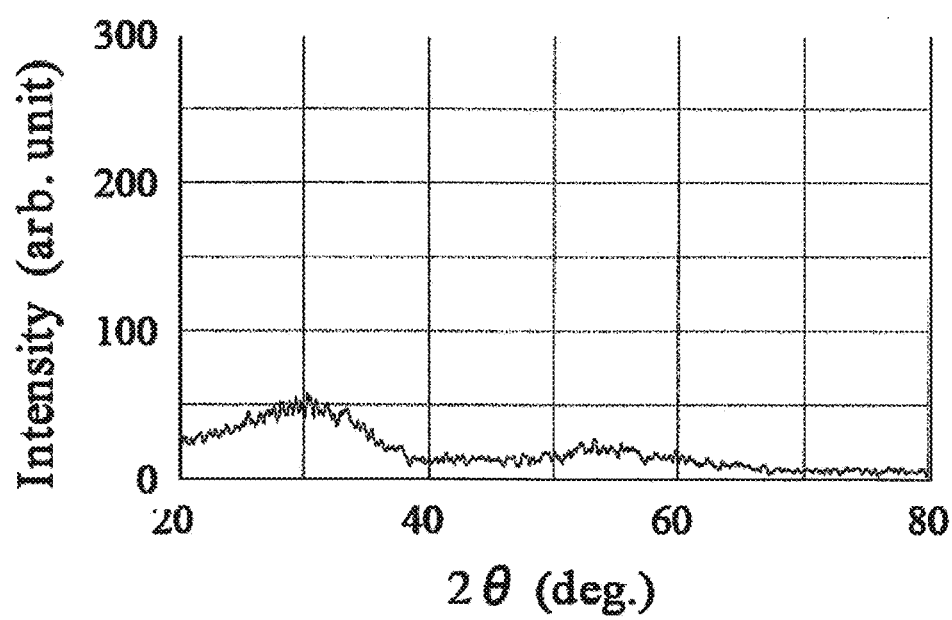
FIG. 36 is a characteristic diagram showing a result of an analysis of a crystallinity of an SnO film according to a working example of the present invention, the analysis being made with an x-ray diffraction.

According to an SnO film formed with the same sputtering condition as the SnO film formed in <Manufacturing of a Reflective Photomask Blank> described above, a composition ratio was analyzed with XPS (X-ray photoelectron spectroscopy), and a crystallinity was analyzed with XRD (X-ray diffraction). The results of the analyses are shown respectively in FIGS. 35 and 36. The composition ratio was approximately O/Sn 1.3, which was within the range of the present invention. Further, according to the XRD, a hallow peak was observed at a diffraction angle of 25 to 35 degrees. Thus, an amorphous structure was observed.

Manufacturing of a Reflective Photomask

First, on top of a half tone type reflective photomask blank described above, an electron beam resist is applied on a silicon nitride film. Thus, a resist pattern was formed using an electron beam writing system. This resist pattern acting as a mask, a patterning of the silicon nitride film and the SnO film was performed using a dry etching, with fluorine gas and chlorine type gas being a primary gas.

Next, a removing of the electron beam resist was performed. A defect inspection of the silicon nitride film and the SnO film pattern was performed. A defect repair using an ion beam was performed as well.

Next, a patterning of the Ru film was performed by a dry etching with oxygen gas being the primary gas. During this etching, the silicon nitride film, which is the top most layer, was exposed to the etching gas. However, since the silicon nitride film originally has a high durability against oxygen gas, the change in the spectral reflectance was small, being less than or equal to 0.2%. Thus, there were no problems regarding any damage to the silicon nitride film.

Next, a cleansing was performed using an SPM cleansing liquid ($H_2SO_4+H_2O_2$, at a temperature of approximately 80° C.) and an APM cleansing liquid ($NH_4OH+H_2O_2+H_2O$, at room temperature). In this way, a half tone type reflective photomask according to the present invention was manufactured.

A measurement of the spectral reflectance was performed before the immersion to the cleansing liquid. As a result, the change in the spectral reflectance was small, at 190 nm to 260 nm. Thus, the durability of the silicon nitride film was preferable.

Using the half tone type reflective photomask described above, a measurement of an EUV reflectance was performed. As a result, the reflectance of the high reflection part was 65%. The reflectance of the low reflection part was 6.1%. Thus, compared to a reflectance in a mask blank state, the increase in the reflectance was only 0.1%. Thus, there were no problems with reference to practicability. Furthermore, before and after the cleansing, a measurement of the pattern line width was performed using an electron beam microscope. The observed change was within the measurement accuracy of the equipment, and did not present any problems.

As described above in detail, by having Sn and oxygen as a primary ingredient of at least one layer of a low reflection part, it was possible to obtain a half tone type reflective photomask with an extremely small film thickness and a superior durability against cleansing.

Working Example 2

Manufacturing of a Reflective Photomask Blank

First, a multi-layered reflection film including 40 pairs of Mo (with a thickness of 2.8 nm) and Si (with a thickness of 4.2 nm) was formed on a low thermal expansion glass substrate using an ion beam sputtering method. Further, on top of this, a dual purpose film having a thickness of 11 nm including Si was formed using a magnetron sputtering method. Thus, a measurement of an EUV reflectance was performed for a high reflection part.

Next, on top of the dual purpose film, an Ru film having a thickness of 21.5 nm was formed. Here, Ru was the target. A magnetron sputtering method was used in which an Ar gas is discharged.

Next, on top of the Ru film, an SnO film having a thickness of 17 nm was formed. Here, Sn was the target. A magnetron sputtering method was used in which an oxygen gas was added to the Ar gas. In this way, a half tone type reflective photomask blank according to the present invention was manufactured.

A measurement of an EUV reflectance of a low reflection part (half tone part) was performed for the half tone type reflective photomask blank manufactured as described above. The reflectance was approximately 5.7% with reference to a high reflection part. Thus, the reflectance was a preferable value for a half tone type mask. Further, a measurement of a spectral reflectance was performed. As a result, the spectral reflectance was less than or equal to 10% in the wavelength range of 190 nm to 260 nm used in a defect inspection. Thus, a sufficient low reflection was achieved.

Manufacturing of a Reflective Photomask

First, on top of the SnO film of the reflective photomask blank manufactured in <Working Example 2>, an electron beam resist is applied. Thus, a resist pattern was formed using an electron beam writing system. This resist pattern acting as a mask, a patterning of the SnO film was performed using a dry etching, with chlorine type gas being a primary gas. Next, a patterning of the Ru film was performed by a dry etching with oxygen gas being the primary gas. During this latter etching, the resist pattern which was acting as a mask was lost. Furthermore, during this latter etching, the SnO film was exposed to the etching gas. However, since the SnO film originally has a high durability against oxygen gas, the change in the spectral reflectance was small, being less than or equal to 0.1%. Thus, there were no problems regarding any damage to the SnO film.

Next, a defect inspection and a defect repair of the SnO film and the Ru film pattern was performed using an electron beam. Thereafter, a cleansing was performed using an SPM cleansing liquid ($H_2SO_4+H_2O_2$, at a temperature of approximately 80° C.) and an APM cleansing liquid ($NH_4OH+H_2O_2+H_2O$, at room temperature). In this way, a half tone type reflective photomask according to the present invention was manufactured.

Incidentally, a measurement of the spectral reflectance was performed before the immersion to the cleansing liquid. As a result, the change in the spectral reflectance was small, at 190 nm to 260 nm. The change with reference to SPM was within 0.2%. The change with reference to APM was within 0.1%. Thus, the durability of the SnO film did not pose any problems in terms of practicability.

Using the half tone type reflective photomask described above, a measurement of an EUV reflectance was performed. As a result, the reflectance of the high reflection part was 65%. The reflectance of the low reflection part was 5.8%. Thus, compared to a reflectance in a mask blank state, the increase in the reflectance was only 0.1%. Thus, there were no problems with reference to practicability. Furthermore, before and after the cleansing, a measurement of the pattern line width was performed using an electron beam microscope. The observed change was within the measurement accuracy of the equipment, and did not present any problems.

As described above in detail, by having Ru or RuO as a primary ingredient of at least one layer of a low reflection part, and by having Sn and oxygen as a primary ingredient of at least one different layer, it was possible to obtain a half tone type reflective photomask with an extremely small film thickness and a superior durability against cleansing. Furthermore, by changing the combination of the film thickness, it was possible to make a selection from among a wide range of reflectance.

Hereinafter, a pattern transfer method using a half tone type reflective photomask according to the present invention is described.

First of all, a photoresist layer is provided on a substrate. A to-be-processed layer is already formed on the surface of the substrate. A selective irradiation of an extreme ultraviolet ray is performed. This extreme ultraviolet ray is reflected via a half tone type reflective photomask according to the present invention.

Next, a portion of the photoresist layer which is unnecessary in the development step is removed. A pattern of the resist layer for etching is formed on the substrate. Thereafter, having the pattern of this resist layer as a mask, the to-be-processed layer is etched. Further, by removing the pattern of the resist layer, it is possible to transfer on the substrate, a pattern which is close to the photomask pattern formed on the half tone type reflective photomask.

INDUSTRIAL APPLICABILITY

An aspect of the present invention is expected to be utilized in a wide range of areas in which a fine processing using an EUV (Extreme Ultra Violet) exposure. In particular, in a manufacturing process of a semiconductor integrated circuit and the like, an aspect of the present invention is expected to be utilized as a reflective photomask used when a transfer of an extremely fine circuit pattern is performed using an EUV exposure.

DESCRIPTION OF REFERENCE NUMERALS

1 Substrate
2 Multi-Layered Reflection Film
3 Capping Film
4 Buffer Film
4' Buffering Film Pattern
5a Lower Layer Absorption Film
5b Upper Layer Absorption Film
5c Anti-Reflection Film
5a' Lower Layer Absorption Film Pattern
5b' Upper Layer Absorption Film Pattern
5c' Anti-Reflection Film Pattern
6 Incident Light
7 High Reflection Light
8 Low Reflection Light
34 Dual Purpose Film Of Capping Film And Buffer Film
10 Reflective Photomask Blank
20 Reflective Photomask
30 Reflective Photomask Blank
40 Reflective Photomask
50 Reflective Photomask Blank
60 Reflective Photomask
70 Reflective Photomask Blank
80 Reflective Photomask

The invention claimed is:

1. A reflective photomask reflecting an EUV light and used to irradiate a reflected light to a transfer sample, the reflective photomask comprising:
    a substrate;
    a high reflection part formed on the substrate; and
    a low reflection part formed and patterned on the high reflection part, wherein
    the patterned low reflection part comprises a first layer of a SnO film and a second layer including Ru;
    the first layer is stacked on the second layer;
    a total combined thickness of the first layer and the second layer is 25 nm to 45 nm;
    the first layer is amorphous (noncrystalline);
    the first layer has an atomic ratio of the oxygen with reference to the Sn (O/Sn) that is 1.0 to 1.5; and
    a first reflected light from the patterned low reflection part has a phase difference of 175 to 185 degrees with reference to a second reflected light from the high reflection part.

2. The reflective photomask according to claim 1, wherein the second layer further comprises oxygen.

3. The reflective photomask according to claim 1, wherein a first reflectance of the patterned low reflection part with reference to an incident ultraviolet ray having a wavelength of 190 nm to 260 nm, is less than or equal to 15%.

4. The reflective photomask according to claim 3, wherein an uppermost layer of the patterned low reflection part is the first layer of a SnO film.

5. The reflective photomask according to claim 3, wherein:
    the patterned low reflection part comprises two or more layers being stacked; and
    an uppermost layer of the patterned low reflection part is a second layer comprising Si and nitrogen.

6. The reflective photomask according to claim 3, wherein:
    the patterned low reflection part comprises two or more layers being stacked; and
    an uppermost layer of the patterned low reflection part is a second layer comprising Si and oxygen.

7. A reflective photomask blank used to form a reflective photomask, the reflective photomask blank comprising:
    a substrate;
    a high reflection part layer formed on the substrate; and
    a low reflection part layer laminated on the high reflection part layer, wherein
    the low reflection part layer comprises a first layer of a SnO film and a second layer including Ru, the first layer being stacked on the second layer,
    a total combined thickness of the first layer and the second layer is 25 nm to 45 nm,
    the first layer is amorphous (noncrystalline),
    the first layer has an atomic ratio of the oxygen with reference to the Sn (O/Sn) is 1.0 to 1.5; and
    the reflective photomask blank is to be patterned for providing a first reflected light from the low reflection part having a phase difference of 175 to 185 degrees with reference to a second reflected light from the high reflection part.

* * * * *